US008373587B2

(12) United States Patent
Tsukamoto

(10) Patent No.: US 8,373,587 B2
(45) Date of Patent: Feb. 12, 2013

(54) SEMICONDUCTOR INTEGRATED CIRCUIT, THRESHOLD VALUE SETTING METHOD, AND COMMUNICATION APPARATUS

(75) Inventor: Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 13/118,737

(22) Filed: May 31, 2011

(65) Prior Publication Data

US 2011/0304359 A1    Dec. 15, 2011

(30) Foreign Application Priority Data

Jun. 10, 2010   (JP) ................................ 2010-133412
Dec. 13, 2010   (JP) ................................ 2010-277309

(51) Int. Cl.
*H03M 1/36*     (2006.01)
(52) U.S. Cl. .................... 341/159; 341/120; 341/155
(58) Field of Classification Search .................. 341/120, 341/155, 159
See application file for complete search history.

(56) References Cited

U.S. PATENT DOCUMENTS

| | | | | |
|---|---|---|---|---|
| 6,288,665 | B1 * | 9/2001 | Tsukamoto et al. | 341/155 |
| 6,373,423 | B1 * | 4/2002 | Knudsen | 341/159 |
| 6,420,983 | B1 | 7/2002 | Feygin et al. | |
| 7,511,652 | B1 * | 3/2009 | Liu et al. | 341/155 |
| 7,652,600 | B2 * | 1/2010 | Van der Plas et al. | 341/120 |

FOREIGN PATENT DOCUMENTS

| | | |
|---|---|---|
| JP | 2002-33663 A | 1/2002 |
| JP | 2003-018008 A | 1/2003 |
| JP | 2008-160593 A | 7/2008 |

OTHER PUBLICATIONS

Yasuhiko Fujita et al., "A Bulk CMOS 20MS/s 7b Flash ADC", IEEE International Solid-State Circuits Conference, Feb. 1984, pp. 56-57, 315, vol. XXVII.
Yuko Tamba et al., "A CMOS 6b 500MSample/s ADC for a Hard Disk Drive Read Channel", IEEE International Solid-State Circuits Conference, Feb. 1999, vol. XLII.
Sanroku Tsukamoto et al., "A CMOS 6-b 200 MSample/s, 3 V-Supply A/D Converter for a PRML Read Channel LSI", IEEE Journal of Solid-State Circuits, Nov. 1996, pp. 1831-1836, vol. 31, No. 11.
Geert Van Der Plas et al., "A 0.16pJ/Conversion-Step 2.5mW 1.25GS/s 4b ADC in a 90nm Digital CMOS Process", IEEE International Solid-State Circuits Conference, Feb. 2006, vol. XLIX.

* cited by examiner

*Primary Examiner* — Khai M Nguyen
(74) *Attorney, Agent, or Firm* — Arent Fox LLP

(57) ABSTRACT

A semiconductor integrated circuit includes first to N-th comparators to compare an input voltage with a threshold value; and a control circuit to perform first and second operations, set a threshold value of the first comparator as a first threshold value, and set a threshold value of an M-th comparator as a second threshold value, wherein the first operation includes an operation where a value obtained by multiplying a value obtained by subtracting the threshold value of the M-th comparator from a threshold value of an (M+1)th comparator by a real number is added to the threshold value of the M-th comparator, and wherein the second operation includes an operation where a value obtained by multiplying a value obtained by subtracting the threshold value of the M-th comparator from a threshold value of an (M−1)th comparator by a real number is added to the threshold value of the M-th comparator.

15 Claims, 22 Drawing Sheets

SEMICONDUCTOR INTEGRATED CIRCUIT, THRESHOLD VALUE SETTING METHOD, AND COMMUNICATION APPARATUS

CROSS-REFERENCE TO RELATED APPLICATIONS

This application claims the benefit of priority from Japanese Patent Application No. 2010-133412 filed on Jun. 10, 2010 and Japanese Patent Application No. 2010-277309 filed on Dec. 13, 2010, the entire contents of which are incorporated herein by reference.

BACKGROUND

1. Field

Embodiments discussed herein relate to a semiconductor integrated circuit.

2. Description of Related Art

In a parallel or serial-parallel analog-to-digital (AD) converter, an input analog voltage is applied to a plurality of comparators in which different threshold values are set, and each comparator compares the input analog voltage with the threshold value. Thermometer codes that are output by the plurality of comparators are encoded by an encoder and are converted into binary codes corresponding to a voltage value. For example, a comparison reference voltage corresponding to the threshold value of each of the plurality of comparators may be generated by a resistance ladder.

Related art is disclosed in Japanese Laid-open Patent Publication No. 2003-18008, Japanese Laid-open Patent Publication No. 2002-33663, Japanese Laid-open Patent Publication No. 2008-160593, Non-Patent Document Yasuhiko Fujita, Eiji Masuda, Shigemi Sakamoto, Tatsuo Sakaue, Yasushi Sato; A bulk CMOS 20MS/s7b flash ADC, IEEE International Solid-State Circuits Conference, vol. XXVII, pp. 56-57, February 1984, Non-Patent Document Yuko Tamba, Kazuo Yamakido; A CMOS 6b 500M Sample/s ADC for a harddisk drive read channel, IEEE International Solid-State Circuits Conference, vol. XLII, pp. 324-325, February 1999, Non-Patent Document Sanroku Tsukamoto, Ian Dedic, Toshiaki Endo, Kazu-yoshi Kikuta, Kunihiko Goto, Osamu Kobayashi; A CMOS 6-b, 200M sample/s, 3 V-supply A/D converter for a PRML read channel LSI, IEEE Journal of Solid-State Circuits, vol. 31, pp. 1831-1836, November 1996, or Non-Patent Document Geert Van der Plas, Stefaan Decoutere, Stephane Donnay; A 0.16 pJ/conversion-step 2.5 mW 1.25 GS/s 4b ADC in a 90 nm digital CMOS process, IEEE International Solid-State Circuits Conference, vol. XLIX, pp. 566-567, February 2006, etc.

SUMMARY

According to one aspect of the embodiments, a semiconductor integrated circuit includes: first to N-th (N is a positive integer) comparators to compare an input voltage with a corresponding threshold value, where N is a positive integer; and a control circuit to perform alternately a first operation and a second operation a plurality of times, to set a threshold value of the first comparator as a first threshold value, and to set a threshold value of an M-th (1<M<N) comparator as a second threshold value, wherein the first operation includes an operation in which, in a first state, a first value, obtained by multiplying a second value obtained by subtracting the threshold value of the M-th comparator from a threshold value of an (M+1)th comparator by a positive real number smaller than 1, is added to the threshold value of the M-th comparator to update, thereby updating the threshold value of the M-th comparator, and wherein the second operation includes an operation in which, in a second state, a third value, obtained by multiplying a fourth value obtained by subtracting the threshold value of the M-th comparator from a threshold value of an (M−1)th comparator by a positive real number smaller than 1, is added to the threshold value of the M-th comparator to update, thereby updating the threshold value of the M-th comparator.

Additional advantages and novel features of the invention will be set forth in part in the description that follows, and in part will become more apparent to those skilled in the art upon examination of the following or upon learning by practice thereof.

DESCRIPTION OF EMBODIMENTS

Comparators have offset variations due to element variations. A comparator including a transistor of an element having a short channel length is used for the purpose of speeding up an AD converter. Because element variations become larger, offset variations may increase variations. An offset may be cancelled before AD conversion. AD conversion may not be performed in a period in which a threshold value is adjusted. A comparator provided in redundancy may adjust a threshold value in background when another comparator performs AD conversion. A comparator for adjusting a threshold value may be used for AD conversion, and a comparator for AD conversion may be used for adjusting a threshold value.

When threshold values are controlled in a digital manner, an appropriate digital code may be set in the comparator. The digital code and the threshold value may not be in a linear relationship. When digital codes are set at a substantially equal interval, the threshold values may not be set at substantially equal intervals.

Figure 1:
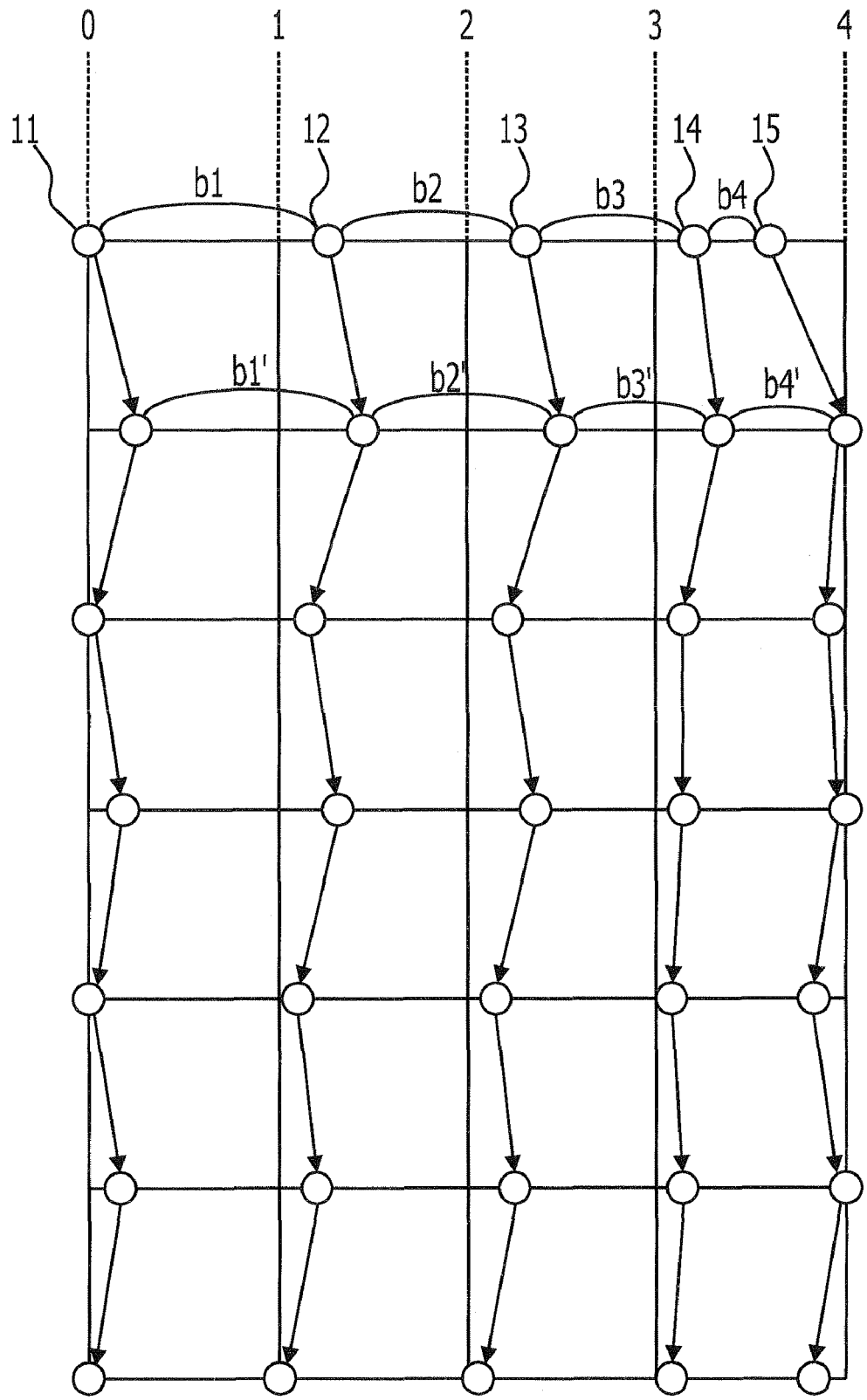
FIG. 1 illustrates an exemplary threshold value of a comparator.

FIG. 1 illustrates an exemplary threshold value of a comparator. In FIG. 1, ○ marks indicate comparators, and the position in the horizontal direction of ○ marks indicates a magnitude of a threshold value that is set in a comparator. For example, time passes from above to down in FIG. 1, and the threshold value changes. For example, the interval between the threshold values 0 to 4 may be substantially equally divided into four portions, and the interval between the threshold values of five comparators 11 to 15 may be set to 0, 1, 2, and 3, respectively.

The range of the threshold values and the interval between threshold values may be arbitrary. The low end of the threshold values may be a value other than 0, and the upper end of the threshold values may be a value other than 4. The interval may be substantially equally divided into a number of divisions other than 4. An accurate digital code for setting a certain threshold value may be unknown. For this reason, the threshold value of the low end and the threshold value of the upper end may not be set to 0 and 4, respectively. For example, the threshold value corresponding to a minimum digital code and the threshold value corresponding to a maximum digital code, which are set in the comparators, are set to the threshold values 0 and 4, respectively, and the interval between the threshold values may be substantially equally divided into four portions. The threshold value corresponding to the minimum digital code and the threshold value corresponding to the maximum digital code are set to unspecified threshold values A0 and A4, respectively, and the interval between the threshold values may be substantially equally divided into four portions. The threshold value corresponding to an arbitrary first digital code and the threshold value corresponding to an arbitrary second digital code may be set to threshold values 0 and 4, respectively, and the interval between the threshold values may be substantially equally divided into four portions.

In FIG. 1, an adjustment may be performed so that an increase/decrease of the threshold values of the comparators 11 to 15 is repeated in accordance with a certain condition, the positions of the threshold values are moved, and the intervals between threshold values become approximately equal intervals. Among the first to fifth comparators 11 to 15, the threshold value of the M-th (1<M<5) comparator, for example, the comparator other than those at both ends, is set to $TH_M$. The threshold value of the (M+1)th comparator is set to $TH_{M+1}$. The threshold value difference between the (M+1)th comparator and the M-th comparator may be $TH_{M+1}-TH_M$. For example, when M=3, the threshold difference $TH_4-TH_3$ between the fourth comparator 14 and the third comparator 13 may be a threshold difference b3. The threshold value of the M-th comparator is updated by adding a value obtained by multiplying $(TH_{M+1}-TH_M)$ by a positive real number smaller than 1 to $TH_M$. For example, the threshold value of the third comparator 13 is increased by an amount r (0<r<1) times b3, thereby updating the threshold value. The similar process may be performed on each of the comparators 11 to 14. The threshold value of the comparator 15 may correspond to a threshold value 4 of the upper end. The threshold differences (inter-threshold distance) b1 to b4 between the comparators 11 to 15 in an initial state change to threshold differences b1' to b4'. The process may be referred to as a first update process.

The threshold difference between the (M−1)th comparator and the M-th comparator may be $TH_{M-1}-TH_M$. In FIG. 1, for example, when M=3, the absolute value of the threshold difference $TH_2-TH_3$ between the second comparator 12 and the third comparator 13 may be a threshold difference b2'. By adding the value obtained by multiplying $(TH_{M-1}-TH_M)$, which is a negative value, by a positive real number smaller than 1 to $TH_M$, the threshold value of the M-th comparator is updated. The threshold value of the third comparator 13 may be decreased by an amount b2' multiplied by r (0<r<1), thereby updating the threshold value. The similar process is performed on each of the comparators 12 to 15. The threshold value of the comparator 11 may correspond to the threshold value 0 of the low end. The process may be referred to as a second update.

The first update and the second update may be alternately performed a plurality of times. Since the threshold value of the first comparator 11 is set to 0 every other time, the threshold value may be set to the neighborhood of 0. Since the threshold value of the fifth comparator 15 is set to 4 every other time, the threshold value may be set to the neighborhood of 4. The second update process may be performed at first. In the initial state illustrated in FIG. 1, the threshold values of the comparators 11 to 15 are arranged in the order of numbers of the comparators. For example, the threshold value of the third comparator 13 may be greater than the threshold value of the fourth comparator 14.

Figure 2:
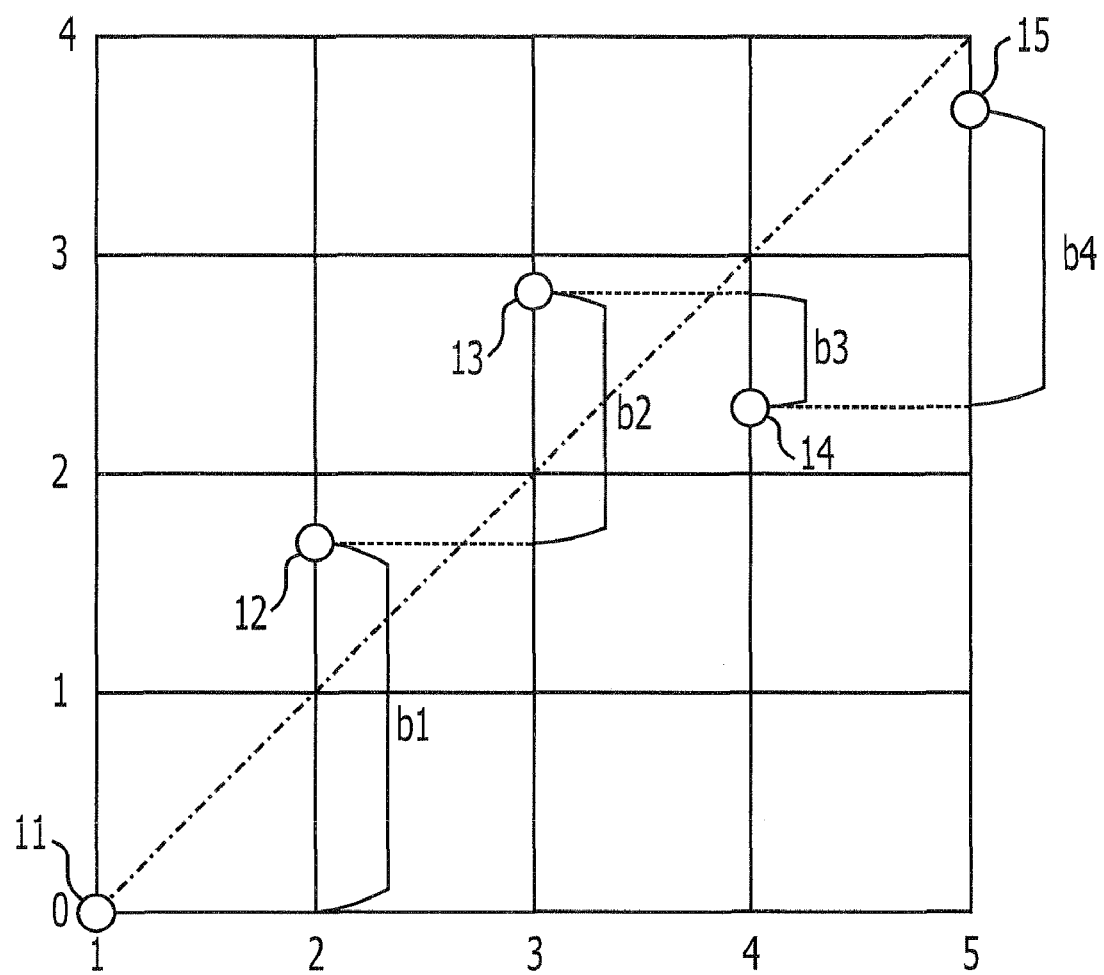
FIG. 2 illustrates an exemplary threshold value of a comparator.

FIG. 2 illustrates an exemplary threshold value of a comparator. In FIG. 2, the threshold values of the comparators 11 to 15 in the initial state are not arranged in sequence. In FIG. 2, the comparator number is illustrated in the horizontal direction, and the value of the threshold value is illustrated in the vertical direction. The threshold value of the third comparator 13 may be greater than the threshold value of the fourth comparator 14. The threshold difference b3 between the threshold value of the fourth comparator 14 and the threshold value of the third comparator 13 when the threshold value of the third comparator 13 is used as a reference may be a negative value. By adding r·b3, the threshold value of the third comparator 13 decreases. The threshold values of the other comparators increase.

In the first update process illustrated in FIG. 1, the threshold value of the first comparator 11 is increased by an amount r·b1, and the threshold value of the second comparator 12 increases by r·b2. The threshold difference b1 is narrowed by r·b1 and is widened by r·b2. b1 changes by an amount r(b2−b1). b2 changes by an amount r(b3−b2), and b3 changes by an amount r(b4−b3). When the threshold value of the fifth comparator 15 in the initial state is 4−r·IN, b4 changes by an amount r(IN−b3). In the second update process, since the threshold value of the first comparator 11 is r·b1, b1 changes by an amount r(b1−b1'). b2 changes by an amount r(b1'−b2'), b3 changes by an amount r(b2'−b3'), and b4 changes by an amount r(b3'−b4').

For example, since b2 is changed by an amount r(b3−b2) by the first update, b2 is decreased when b2>b3. When the relationship of b2>b1 continues after the first update, b2' is changed by an amount r(b1'−b2') by the second update, and b2' is narrowed. When a certain threshold difference is greater than the threshold difference at both sides, the certain threshold difference is decreased by the update. When a certain threshold difference is smaller than the threshold value difference at both sides, the certain threshold difference is increased by the update. The certain threshold difference approaches the threshold difference at both sides by the update.

When the relationship of b1<b2<b3 is maintained, b2 is increased by an amount r(b3−b2) by the first update, and b2' is decreased by an amount r(b1'−b2') by the second update. For example, when b1 and b3 do not change, since r(b3−b2) and r(b1−b2) become substantially equal to each other in a stable state, b2 may become an average value of b3 and b1. When b1 and b3 are changed, b2 may be updated so as to approach the average value.

When the certain threshold difference is greater than or smaller than the threshold difference at both sides, the threshold difference is updated so as to approach the threshold difference as a result of the update. When the threshold difference is a threshold value difference at both sides, the threshold difference is updated so as to approach the average of the threshold value differences as a result of the update. The threshold difference increases in a straight line manner, or decreases in a straight line manner, or is maintained at a certain value from end to end.

Figure 3:
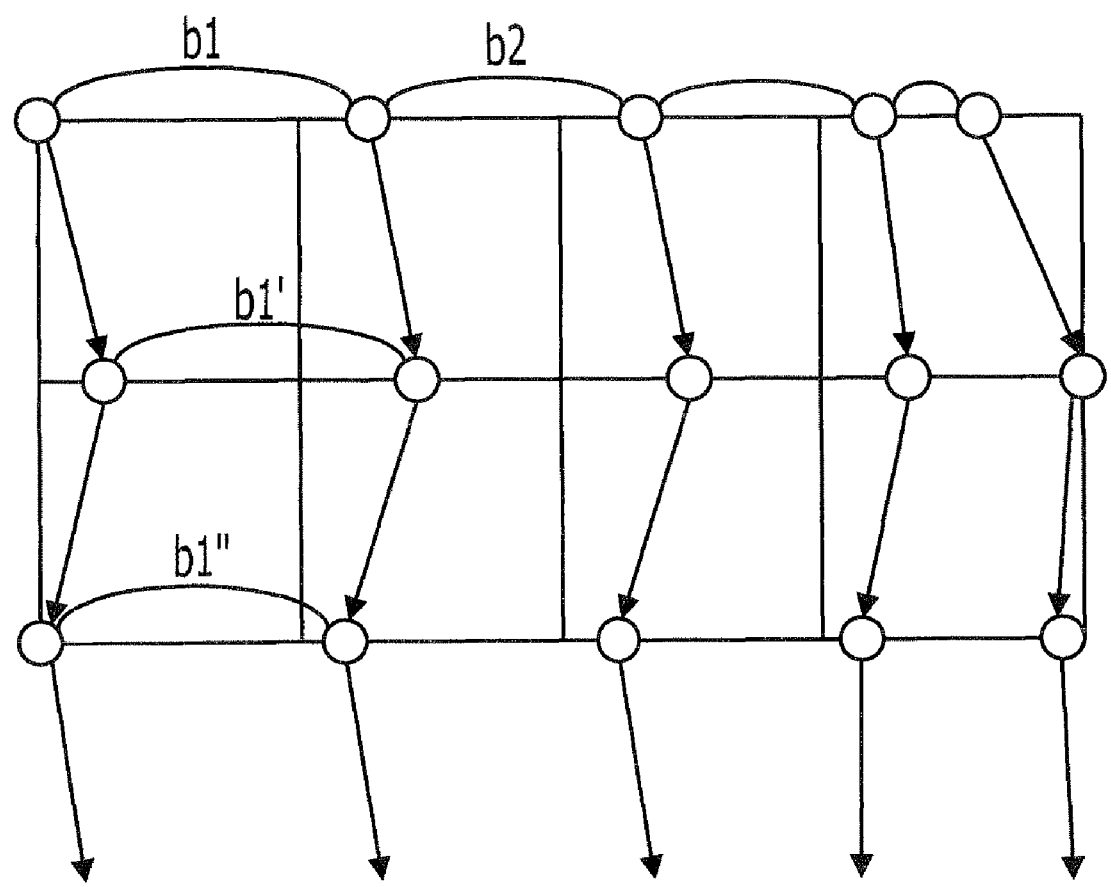
FIG. 3 illustrates an exemplary change in a threshold value.

FIG. 3 illustrates an exemplary change in a threshold difference. The threshold differences illustrated in FIG. 3 may correspond to threshold differences at the ends of a plurality of comparators. In FIG. 3, for example, the threshold difference b1 illustrated in FIG. 1 may be updated to b1' and b1". b1' and b1" are represented by the following equations.

$$b1' = b1 + r(b2 - b1)$$
$$b1'' = b1' + r(b1 - b1') =$$
$$(1-r)b1' + rb1 = (1-r)\{b1 + r(b2-b1)\} + rb1 = b1 + (r-r^2)(b2-b1)$$

Since r is smaller than 1, $(r-r^2)$ may be positive. When b2>b1, b1 increases by the first update and the second update. When b2<b1, b1 decreases by the first update and the second update. The update is repeated and b1 may change so that b1 becomes substantially equal to b2.

After b1 and b2 become substantially equal to each other, the length of b2 may not be changed in the second update. In the first update, b2 is changed by an amount r(b3−b2). When b3>b2, b2 is increased, and when b3<b2, b2 is decreased. The update is repeated and b2 may be changed so that b2 becomes substantially equal to b3.

The threshold differences may change so that the threshold differences become substantially equal to each other from the left end that is constrained to the threshold value. The threshold difference may change so that the threshold differences become substantially equal to each other from the right end that is constrained to the threshold value. The threshold difference is increased in a straight line manner, or is decreased in a straight line manner, or is maintained at a certain value from end to end. These changes may be combined, and finally, a plurality of threshold differences may approach a certain distribution from end to end. The threshold values of the comparators 11 to 15 may be arranged at substantially equal intervals from the low end threshold value 0 to the upper end threshold value 4.

In the first update, the threshold value may be updated by adding $(TH_{M+1}-TH_M)$ multiplied by r to $TH_M$. In the second update, the threshold value may be updated by adding $(TH_{M-1}-TH_M)$ multiplied by r to $TH_M$. A digital code for setting a desired threshold value may be undefined. The values of the threshold values ($TH_{M-1}$ and $TH_{M+1}$) of the adjacent comparators may be undefined, and the threshold value ($TH_M$) of the target comparator may be undefined. For example, the input voltage and the threshold value may be compared with each other in a target comparator, the input voltage and the threshold value may be compared with each other in a comparator, and these comparison results may be compared with each other. A plurality of comparisons are performed while changing the input voltage, and the code of the target comparator is changed. When the comparison results match each other at a certain ratio or higher, it may be determined that the threshold value of the target comparator matches the threshold value of the adjacent comparator. The value obtained by multiplying the difference between the code of the target comparator at this time and the original code of the target comparator by r may be added to the original code, and the threshold value may be updated.

As a result of the repeated operation, the threshold value may be converged to a desired threshold value. For example, the threshold value difference is not accurately multiplied by r by multiplying the difference between two codes by r. For example, when 0<r<1, the threshold value may be converged regardless of the value r. As illustrated in FIG. 1, when r changes as time passes, the threshold value may be converged to a desired threshold value. r may not be a certain value from beginning to end. As illustrated in FIG. 1, substantially the same r may be set to the comparators 11 to 15 in an update, for example, updating b1 to b4 to b1' to b4', and another update, for example, an update immediately after a certain update. For example, when the update of the threshold value is temporarily stopped in the repetition of the update of the threshold value of a certain comparator, the threshold value may be converged to a desired threshold value by the subsequent restarting of the update.

When 0<r<1, the threshold value is converged regardless of the value r and, for example, r may be approximately 0.1. For example, when r is 0.9, the threshold values of the comparators 11 to 15 may continue to increase or decrease at an amplitude of approximately 0.9. Since the vibration width in the neighborhood of a desired threshold value in each comparator is large, an error of 0.9 may occur at the completion of the update of the threshold value at a certain time. When r is 0.1, the threshold values of the comparators 11 to 15 may continue to increase or decrease at an amplitude of approximately 0.1. Since the vibration width in the neighborhood of a desired threshold value in each comparator is small, the threshold value of each comparator may be close to a desired threshold value at the completion of the update of the threshold value at a certain time. In an AD conversion, since an error smaller than or equal to 0.5 LSB, for example, a differential nonlinearity error, is permitted, 0<r<0.5 may be permitted. When 0<r<1, the threshold value is converged, for example, becomes a vibration at a stable fixed position. For example, when r is 0.01, it may take time until the threshold value is converged, for example, becoming a vibration at a stable position. Appropriate r may be set based on a desired accuracy and convergence time period.

Figure 4:
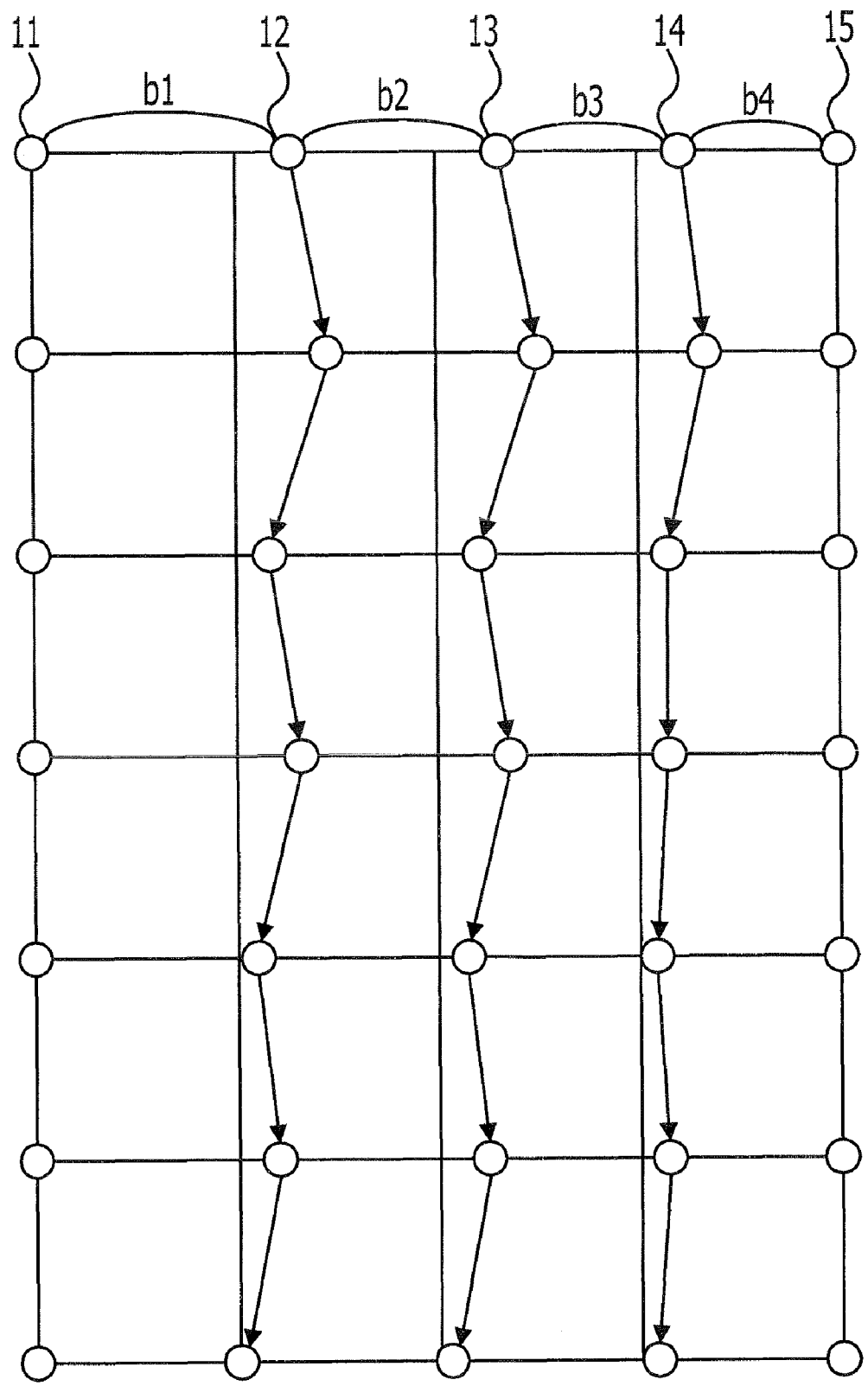
FIG. 4 illustrates an exemplary threshold value.

FIG. 4 illustrates an exemplary threshold value. In FIG. 4, threshold values at both ends of the comparators 11 to 15 are set to certain values. In FIG. 4, as illustrated in FIG. 1, the threshold values of the comparators 11 to 15 may be set at substantially equal intervals.

For example, by adding the value, which is obtained by multiplying $(TH_{M+1}-TH_M)$ by a positive real number smaller than 1, to $TH_M$, the threshold value of the M-th comparator is updated (first update). By adding the value, which is obtained by multiplying $(TH_{M-1}-TH_M)$ by a positive real number smaller than 1, to $TH_M$, the threshold value of the M-th comparator is updated (second update). By alternately performing the first update and the second update, the threshold values of the comparators 11 to 15 may be arranged at substantially equal intervals between the low end threshold value 0 and the upper end threshold value 4. The threshold value of the first comparator 11 may be set to 0. The threshold value of the fifth comparator 15 may be set to 4.

b1″ after the second update with respect to b1 in the initial state and b1′ after the first update is represented as follows.

$$b1'' = (1-r)b1' = (1-r)(b1 + r \cdot b2) = b1 + r(b2 - b1)$$

As a result of the repetition of the update, b1 is changed so as to become substantially equal to b2. The remaining operations may be substantially the same or similar operations as illustrated in FIG. 1.

Figure 5:
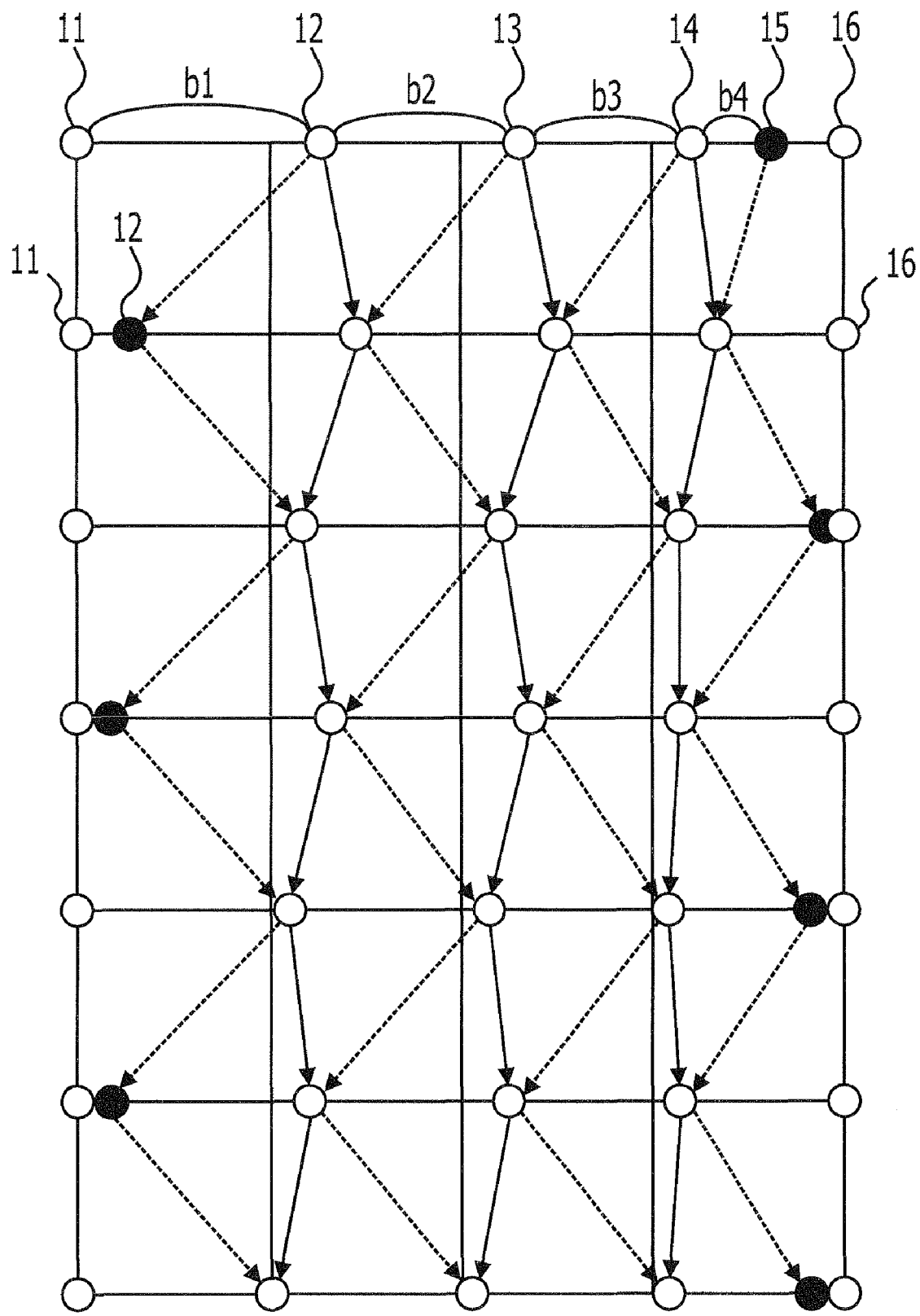
FIG. 5 illustrates an exemplary setting of a threshold value.

FIG. 5 illustrates an exemplary setting of threshold values. In FIG. 5, a redundant sixth comparator 16 is provided. After the setting of the threshold values of the comparators 11 to 15 illustrated in FIG. 1 is completed, an encoder encodes the outputs of the comparators 11 to 15.

In FIG. 5, the comparators 11 to 16 are provided. In the initial state, the comparators 11, 12, 13, 14, and 16 other than the fifth comparator 15 compare the input voltages with the respective threshold values, and supply the comparison results to the encoder, whereby AD conversion is performed. While AD conversion is being performed, the threshold value of the fifth comparator 15 that is disconnected from the encoder is updated. After the threshold value of the fifth comparator 15 is updated, the fifth comparator 15 may be coupled to the encoder, and a comparator that is selected from among the comparators 11 to 15 is disconnected from the encoder, and the threshold value may be updated. For example, the fourth comparator 14 may be disconnected from the encoder, and the threshold value may be updated. When the threshold value is updated, the comparators 11, 12, 13, 15, and 16 may perform AD conversion.

In FIG. 5, by adding the value, which is obtained by multiplying $(TH_{M-1}-TH_M)$ by a positive real number smaller than 1, to $TH_M$, the threshold value of the M-th comparator is updated. For example, by adding the value, which is obtained by multiplying $(TH_4-TH_5)$ by a positive real number smaller than 1, to the threshold value $TH_5$ of the fifth comparator 15, the threshold value of the fifth comparator 15 is updated. The positive real number smaller than 1 may be (1−r) when the coefficient of the multiplication illustrated in FIG. 1 is r. As illustrated in FIG. 5, the fifth comparator 15 in which the threshold value has been updated is replaced with the fourth comparator 14. The comparator that performs the comparison in the neighborhood of the threshold value 3 is replaced from the fourth comparator 14 in the initial state to the fifth comparator 15, and is further replaced with the fourth comparator 14. The arrows of the dotted lines illustrated in FIG. 5 indicate changes in threshold values in each comparator. The arrows of the solid lines indicate replacements of comparators that make comparisons in the neighborhood of a certain threshold value.

The fourth comparator 14 replaced with the fifth comparator 15 is disconnected from the encoder, and the threshold value is updated. After the update of the threshold value of the fourth comparator 14 is completed, the fourth comparator 14 is replaced with the third comparator 13. The third comparator 13 is disconnected from the encoder, and the threshold value is updated. After the update of the threshold value of the third comparator 13 is completed, the third comparator 13 is replaced with the second comparator 12. The second comparator 12 is disconnected from the encoder, and the threshold value is updated. By adding the value, which is obtained by multiplying $(TH_1-TH_2)$ by a positive real number smaller than 1, to the threshold value $TH_2$ of the second comparator 12, the threshold value of the second comparator 12 is updated. The threshold value of the second comparator 12 is decreased by an amount $(1-r) \cdot b1$, and the threshold value of the second comparator 12 is updated. An update at one stage for the comparators 11 to 16 may be completed. The threshold values of the comparators 11 and 16 at both ends may be set to 0 and 4, respectively. Black circles illustrated in FIG. 5 indicate redundant comparators at each stage when the update starts, for example, comparators that are disconnected from the encoder.

By adding the value, which is obtained by multiplying $(TH_{M+1}-TH_M)$ by a positive real number smaller than 1, to $TH_M$, the threshold value of the M-th comparator is updated. For example, by adding the value, which is obtained by multiplying $(TH_3-TH_2)$ by a positive real number smaller than 1, to the threshold value $TH_2$ of the second comparator 12, the threshold value of the second comparator 12 is updated. The threshold value of the second comparator 12 is increased by an amount $(1-r) \cdot b2$, and the threshold value of the second comparator 12 is updated. After the update of the threshold value of the second comparator 12 is completed, the second comparator 12 is replaced with the third comparator 13. The third comparator 13 is disconnected from the encoder, and the threshold value is updated. Similarly, the threshold values of the comparators 13 to 15 may be updated.

In FIG. 5, for example, the comparison result in which the comparator compared the input voltage with the threshold value may be compared with the comparison result in which the adjacent comparator compared the input voltage with the threshold value. When the code of the comparator is changed in accordance with a plurality of comparisons performed by changing the input voltage and the comparison results match at a certain ratio or higher, it may be determined that the threshold value of the comparator is substantially the same as the threshold value of the adjacent comparator. The value obtained by multiplying the difference between the code of the comparator at this time and the code of the first comparator by (1−r) may be added to the first code, and the threshold value may be updated.

Figure 6:
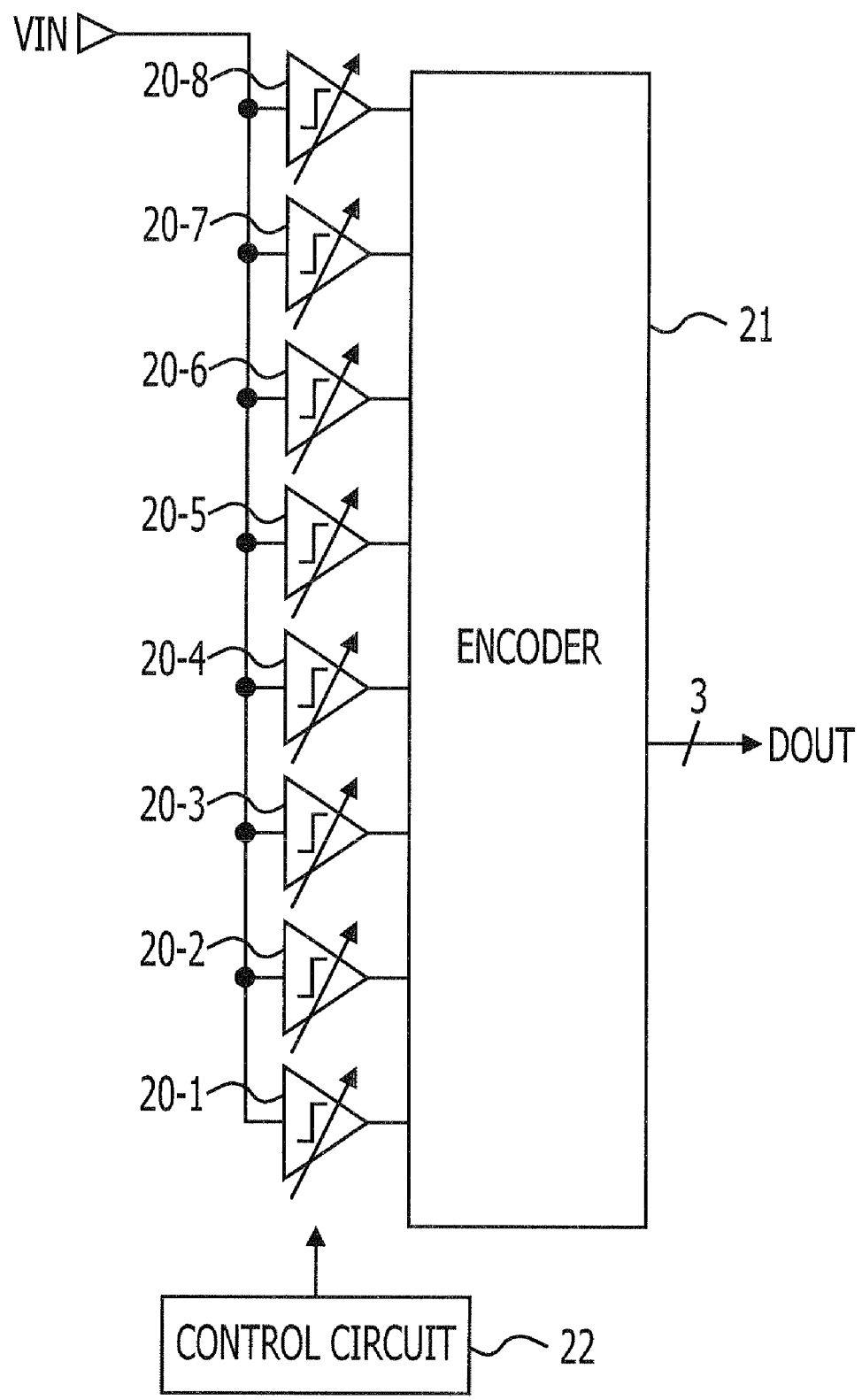
FIG. 6 illustrates an exemplary semiconductor integrated circuit.

FIG. 6 illustrates an exemplary semiconductor integrated circuit. The semiconductor integrated circuit illustrated in FIG. 6 includes a plurality of comparators that compare an input voltage with a threshold value. The semiconductor integrated circuit illustrated in FIG. 6 may include a fully parallel or serial-parallel AD converter. The semiconductor integrated circuit includes a plurality of comparators 20-1 to 20-8, an encoder 21, and a control circuit 22. A threshold value is set in the first to eighth comparators 20-1 to 20-8 in accordance with a digital code input from the control circuit 22. FIG. 6 illustrates a single-ended AD converter. The semiconductor integrated circuit illustrated in FIG. 6 may be an AD converter for a differential signal.

The comparators 20-1 to 20-8 receive an input analog electrical potential VIN, compare the input analog electrical potential VIN with a threshold value, and output the comparison result. When the input analog electrical potential VIN is greater than the threshold value, each comparator may output "1", and when the input analog electrical potential VIN is smaller than or equal to the threshold value, each comparator may output "0". When an appropriate threshold value has been set, the comparators 20-1 to 20-8 may output a thermometer code such that the output of the comparator of the low order is "1" and the output of the other comparators is "0", for example, "00001111". The comparators 20-1 to 20-8 may include at least one redundant comparator. The redundant comparator is disconnected from the encoder 21 by the control circuit 22, and the threshold value is updated. The encoder 21 performs coding based on the outputs of the other comparators, and outputs a 3-bit binary code Dout. For example, the AD conversion result may be 3 bits. The number of output bits of the AD converter may be arbitrary.

Figure 7:
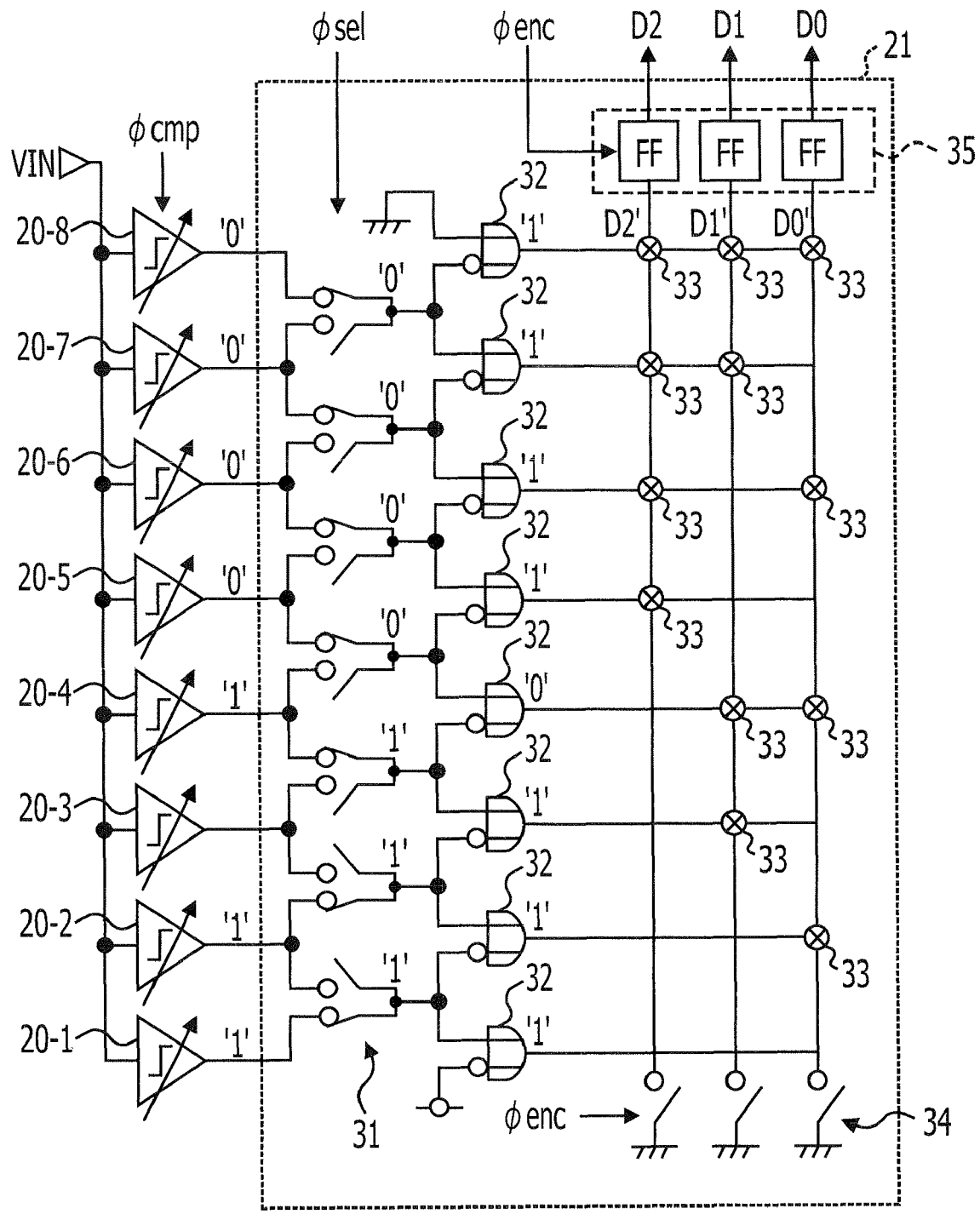
FIG. 7 illustrates an exemplary encoder.

FIG. 7 illustrates an exemplary encoder. An encoder 21 illustrated in FIG. 7 includes a switch circuit 31, a plurality of OR gates 32 having a negative logical input, a wired OR circuit 33, a switch circuit 34, and flip-flop circuits 35. The switch circuit 31 includes, for example, a plurality of switches having substantially the same or similar configuration. Each switch receives outputs of two adjacent comparators among the comparators 20-1 to 20-8, selects one of the outputs, and supplies it to the OR gate 32 at the next stage. The switch at the low order side selects the output of the comparator at the low order side of the two adjacent comparators, and the switch at the high order side selects the output of the comparator at the high order side of the two adjacent comparators, thereby causing the comparator at the boundary to be disconnected from the encoder 21. In FIG. 7, the third comparator 20-3 among the comparators 20-1 to 20-8 may be disconnected from the encoder 21. A switch control signal ϕsel for controlling the connection of the switch circuit 31 may be supplied from, for example, the control circuit 22 illustrated in FIG. 6.

The input from the comparator at the low order side among the two inputs is inverted and supplied to the OR gate 32. For this reason, the output of the OR gate 32 corresponding to the boundary position between the thermometer codes 1 and 0 may be 0, and the output of the other OR gate 32 may be 1. In FIG. 7, the output of the fourth OR gate 32 from the low order side is 0, and the boundary position between the thermometer codes 1 and 0 is detected. The wired OR circuit 33 may be provided at one of the intersection points among the intersection points of the 8 output lines of eight OR gates 32 and the three input lines of the flip-flop circuit 35. The wired OR circuit 33 couples the input line of the flip-flop circuit 35 to the ground electrical potential when the output of the corresponding OR gate 32 is 0. For example, four wired OR circuits 33 are coupled to one input line of the flip-flop circuit 35. Therefore, when one of the outputs of the four OR gates 32, in which the four wired OR circuits 33 are at an intersection point, becomes "0", the electrical potential of the input line may become a low level. A position where is "0" among eight outputs of eight OR gates 32 is coded to 3 bits, and coded data D0', D1', and D3' is stored in the flip-flop circuit 35. The 3-bit data stored in the flip-flop circuit 35 is output as encoded results D0, D1, and D2. The switch circuit 34 is made open at an encoding time. The switch circuit 34 becomes conductive at a reset time, and couples the input of the flip-flop circuit 35 to the ground so as to reset the flip-flop circuit 35. An encoding control signal ϕenc for controlling the operation timing of the flip-flop circuit 35 and the switch circuit 34 may be supplied from, for example, the control circuit 22 illustrated in FIG. 6.

Figure 8:
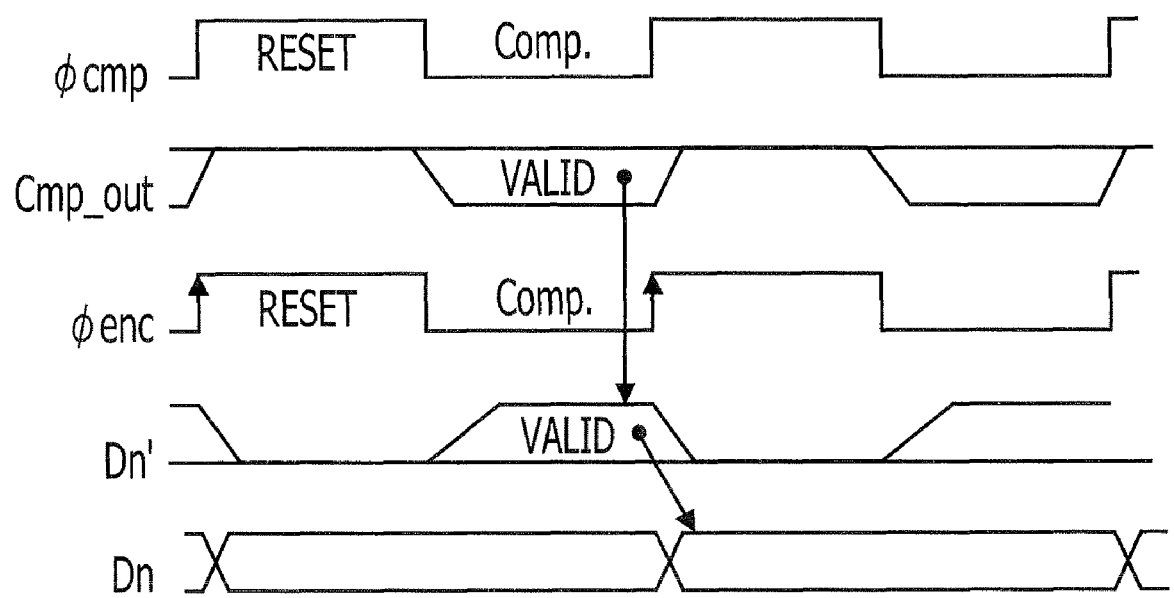
FIG. 8 illustrates an exemplary operation of a comparator and an encoder.

FIG. 8 illustrates an exemplary operation of a comparator and an encoder. The comparators and the encoder illustrated in FIG. 8 may be the comparators 20-1 to 20-8 and the encoder 21 illustrated in FIG. 7. At a reset timing Reset, a comparator control signal ϕcmp supplied from, for example, the control circuit 22 to the comparators 20-1 to 20-8, which are illustrated in FIG. 6, becomes a high level, and the comparators 20-1 to 20-8 are reset. At the reset timing Reset, the encoding control signal ϕenc becomes a high level, the switch circuit 34 becomes conductive, and the input of the flip-flop circuit 35 is coupled to the ground. The input data Dn' of the flip-flop circuit 35, for example, D0', D1', and D3', which are illustrated in FIG. 7, is reset to 0. At a comparison operation timing Comp, the comparator control signal ϕcmp supplied to the comparators 20-1 to 20-8 becomes a low level, and the comparators 20-1 to 20-8 perform comparisons. Outputs Cmp_out of the comparators 20-1 to 20-8 become effective. The encoding control signal ϕenc becomes a low level, the switch circuit 34 enters a non-conductive state, and the input data Dn' of the flip-flop circuit 35 becomes effective. The encoding control signal ϕenc is also supplied to the flip-flop circuit 35. The flip-flop circuit 35 latches the input data Dn' at a rising edge of the encoding control signal ϕenc.

Figure 9:
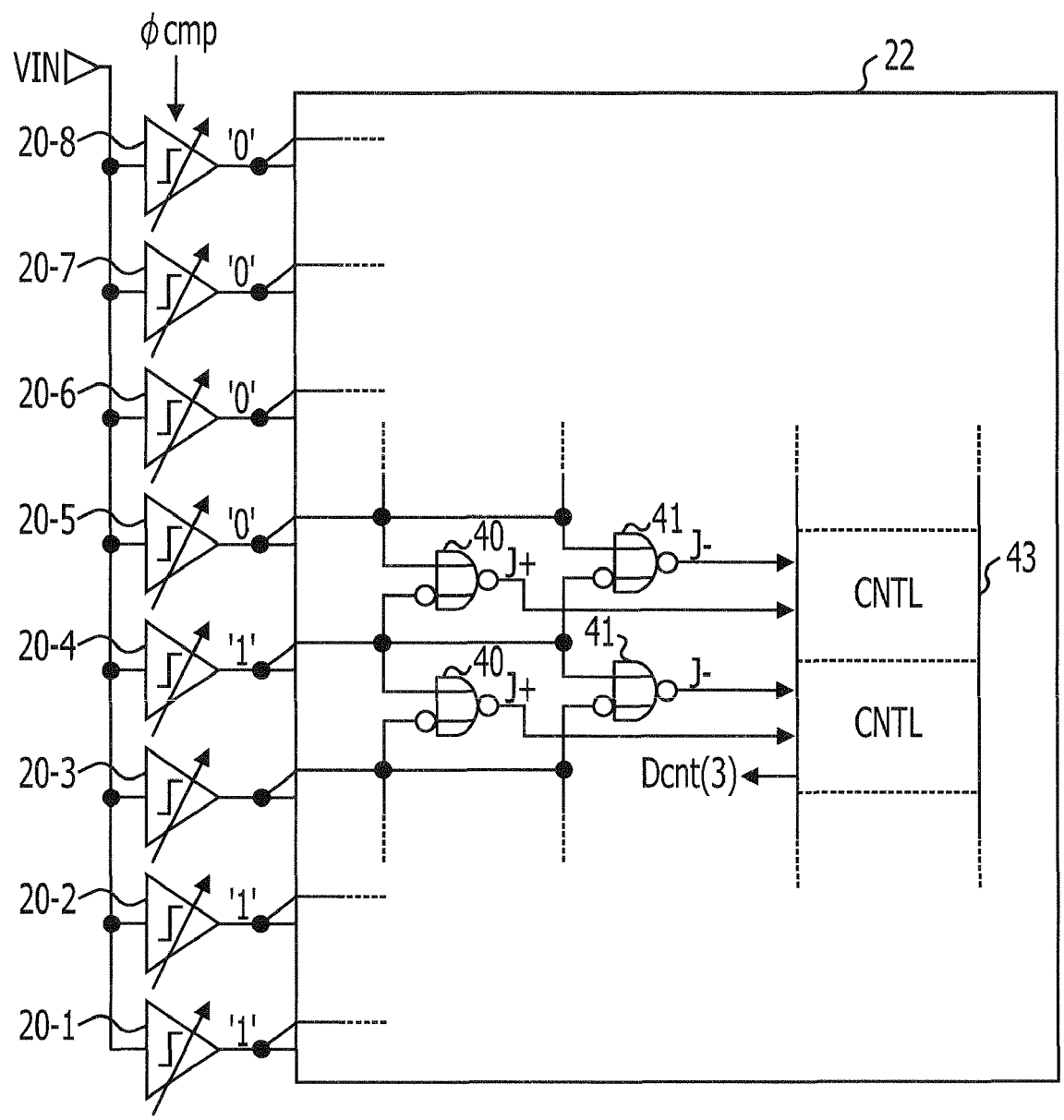
FIG. 9 illustrates an exemplary update of a threshold value.

FIG. 9 illustrates an exemplary update of a threshold value. For example, the control circuit 22 updates the threshold value of the redundant comparator. As illustrated in FIG. 9, the control circuit 22 includes a plurality of NOR gates 40 having a negative logical input at the low order side, a plurality of NOR gates 41 having a negative logical input at the high order side, and a control logic circuit 43. A pair of NOR gates including the NOR gate 40 and the NOR gate 41 receive outputs of two adjacent comparators. Since the number of combinations of two adjacent comparators among the comparators 20-1 to 20-8 is 7, seven pairs of NOR gates may be provided. FIG. 9 illustrates a pair of NOR gates for the third and fourth comparators 20-3 and 20-4, and a pair of NOR gates for the fourth and fifth comparators 20-4 and 20-5.

The output of each of the comparators 20-1 to 20-8 is supplied to the encoder 21 and is also supplied to the control circuit 22. The pair of NOR gates corresponding to two adjacent comparators determine whether or not the input voltage VIN is greater than, smaller than, or between the two threshold values of the two comparators. For example, as illustrated in FIG. 7, the third comparator 20-3 may be a redundant comparator.

When the input voltage VIN is lower than the threshold value of the third comparator 20-3 and the threshold value of the fourth comparator 20-4, the output J+ of the NOR gate 40 and the output J− of the NOR gate 41 may be 0. When the input voltage VIN is higher than the threshold value of the third comparator 20-3 and the threshold value of the fourth comparator 20-4, the output J+ of the corresponding NOR gate 40 and the output J− of the corresponding NOR gate 41 may be 0. When the output J+ and the output J− are 0, the control logic circuit 43 may not operate.

When the input voltage VIN is between the threshold value of the third comparator 20-3 and the threshold value of the fourth comparator 20-4, the output J+ and the output J− of the corresponding NOR gate are changed in accordance with the magnitude relationship between the threshold value $TH_3$ of the third comparator 20-3 and the threshold value $TH_4$ of the fourth comparator 20-4. When $TH_3 < TH_4$, since the outputs of the third comparator 20-3 and the fourth comparator 20-4 are 1 and 0, respectively, the output J+ of the NOR gate 40 and the output J− of the NOR gate 41 may be 1 and 0, respectively. The control logic circuit 43 makes the digital code Dcnt(3) for the third comparator 20-3 increase by 1, and makes the threshold value $TH_3$ of the third comparator 20-3 increase by an amount of a minimum step width. Therefore, $TH_3$ approaches $TH_4$. When $TH_3 > TH_4$, since the outputs of the third comparator 20-3 and the fourth comparator 20-4 are 0 and 1, respectively, the output J+ of the NOR gate 40 and the output J− of the NOR gate 41 are 0 and 1, respectively. The control logic circuit 43 makes the digital code Dcnt(3) for the third comparator 20-3 increase by 1, and the threshold value $TH_3$ of the third comparator 20-3 increase by an amount of the minimum step width. Therefore, $TH_3$ approaches $TH_4$. The input analog voltage VIN that is input to the AD converter is compared with the threshold value, and the threshold value of the third comparator 20-3 is changed in accordance with the comparison result.

When $TH_3$ and $TH_4$ become equal to each other, the output J+ of the NOR gate 40 and the output J− of the NOR gate 41 may become 0 regardless of the input analog voltage VIN. For example, when the comparison between the input analog voltage VIN and each threshold value is performed 1000 times, the output J+ and the output J− may become 0 in the 1000 comparisons. When $TH_3$ and $TH_4$ do not match with each other as a result of the setting of the digital code Dcnt(3), for example, when a difference corresponding to the minimum resolution of the comparator exists, the output J+ and the output J− may differ from each other in multiple comparisons. For example, when the output J+ and the output J− are 0 in 1000 comparisons, for example, when the comparison results match with each other at a certain ratio or higher, for example, at 99.5% or higher, it is determined that $TH_3$ and $TH_4$ are substantially equal to each other, and $TH_3$ may be updated. For example, when the output J+ and the output J− are 0, for example, when the comparison results match each other, continuously in a certain number of times, it is determined that $TH_3$ and $TH_4$ are substantially equal to each other, and $TH_3$ may be updated. For example, in the update, the value obtained by multiplying the difference between the digital codes when $TH_3$ and $TH_4$ are substantially equal to each other and the initial digital code by a positive real number smaller than 1 is added to the first digital code. The value obtained by multiplying ($TH_4-TH_3$) by a positive real number smaller than 1 is added to $TH_3$, and the threshold value of the third comparator is updated.

After the update of $TH_3$ is completed, the third comparator 20-3 is coupled to the encoder 21, and the fourth comparator 20-4 is disconnected from the encoder 21. The fourth comparator 20-4 is set as a redundant comparator, and the threshold value of the fourth comparator 20-4 is updated.

Figure 10:
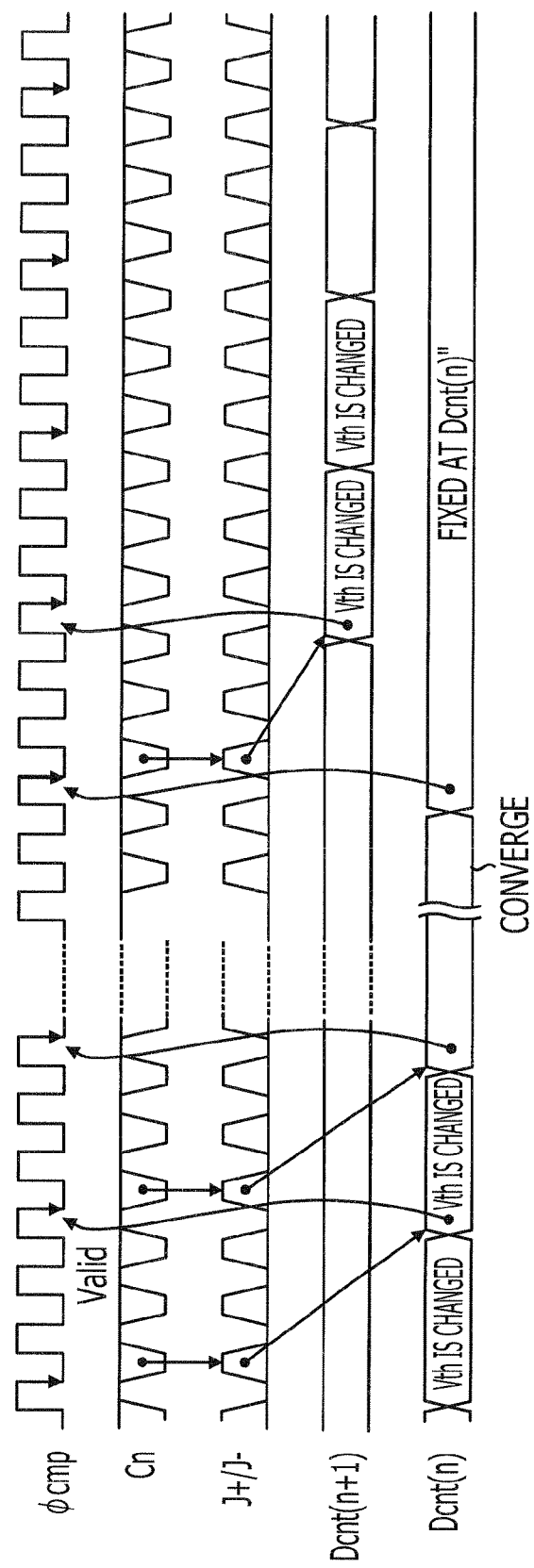
FIG. 10 illustrates an exemplary update of a threshold value.

FIG. 10 illustrates an exemplary update of a threshold value. A comparator control signal φcmp illustrated in FIG. 10 may correspond to the comparator control signal illustrated in FIG. 8, and is used to control the reset timing and the comparison timing of the comparators 20-1 to 20-8. When the comparator control signal φcmp is at a low level, each comparator performs a comparison, and the output of each comparator becomes effective. In FIG. 10, an n-th comparator is set as a redundant comparator, and the threshold value is updated. Cn denotes the output of the n-th comparator. Similarly to FIG. 9, the control logic circuit 43 of the control circuit 22 increases or decreases the digital code Dcnt(n), which is supplied to the n-th comparator, by 1 in accordance with the output J+ and the output J−, thereby changing the threshold value Vth of the n-th comparator. In FIG. 10, when the comparator control signal φcmp corresponds to the clock, the threshold value Vth is set to a threshold value corresponding to the output J+ and the output J− in a 3-clock cycle. The threshold value Vth is changed in accordance with the result of the comparison operation. When the output J+ and the output J− are 0, the threshold value Vth may not be changed and maintained. When the output J+ and the output J− are 0 at a certain ratio or higher in a plurality of comparisons, for example, when the comparison results match each other, it may be determined that the threshold value of the n-th comparator and the threshold value of the (n+1)th comparator become substantially equal to each other, for example, are converged. As illustrated in FIG. 10, the digital code Dcnt(n) of the n-th comparator is set, and the digital code Dcnt(n+1) of the next (n+1)th comparator is adjusted.

Figure 11:
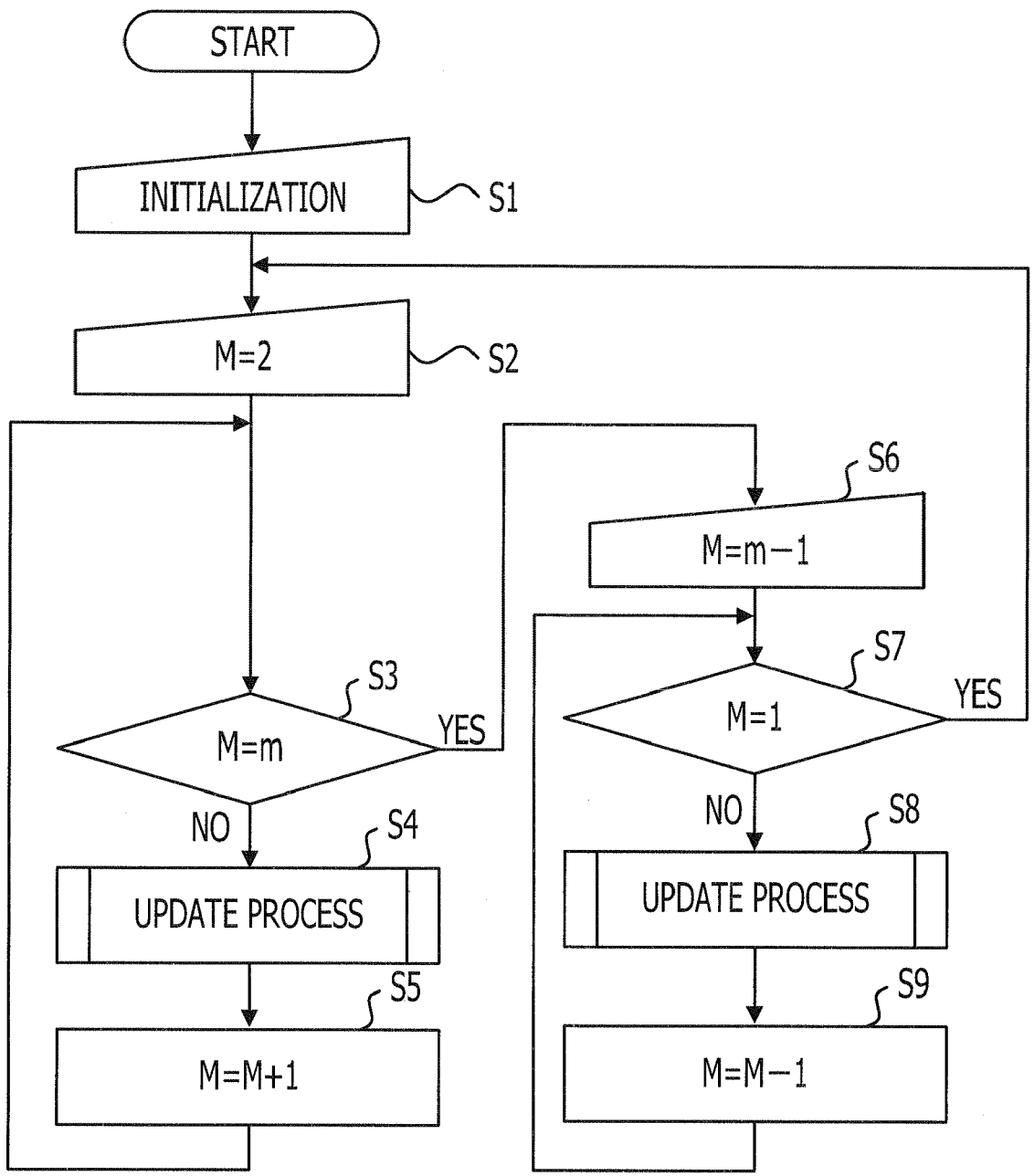
FIG. 11 illustrates an exemplary update of a threshold value.

FIG. 11 illustrates an exemplary update of a threshold value. In FIG. 11, threshold values of a plurality of comparators of an AD converter are updated. The process illustrated in FIG. 11 may be performed by, for example, the control circuit 22 illustrated in FIG. 6. In FIG. 11, the number of comparators provided in the AD converter may be m, and, for example, may correspond to m=8 illustrated in FIG. 6. In an operation S1, a digital code initial value is set in a comparator. For example, a minimum digital code and a maximum digital code may be set in the first comparator and the M-th comparator arranged on both sides. The initial values of the digital codes that are set in the second to (M−1)th comparators may be arbitrary. For example, initial values obtained by equally dividing the range from the minimum digital code to the maximum digital code may be set.

In an operation S2, a variable M is initialized to 2. The variable M may indicate the M-th comparator. In an operation S3, it is determined whether or not the variable M is equal to the number m of comparators. When the variable M is not equal to the number m of comparators, the process proceeds to an operation S4. In the operation S4, as illustrated in FIG. 9, the threshold value of the M-th comparator is updated. After the threshold value of the M-th comparator is updated, in an operation S5, the variable M is incremented by 1, the next comparator is set as a redundant comparator, and the threshold value is updated. The process returns to the operation S3, and the threshold value of the next comparator is updated.

When the variable M is equal to the total number m of comparators, the process proceeds to an operation S6. In the operation S6, the variable M is set to m−1. The threshold value of the comparator at the end, for example, the M-th comparator, is set to a certain value. In an operation S7, it is determined whether or not the variable M is equal to 1. When the variable M is not equal to 1, the process proceeds to an operation S8. In the operation S8, as illustrated in FIG. 9, the threshold value of the M-th comparator is updated. After the threshold value of the M-th comparator is updated, in an operation S9, the variable M is set to M−1, the next comparator is set as a redundant comparator, and the threshold value is updated. The process returns to the operation S7, whereby the threshold value of the next comparator is updated.

When the variable M is equal to 1, the process proceeds to the operation S2. In the operation S2, the variable M is set to 2. The threshold value of the comparator at the end, for example, the first comparator, is set to a certain value. The processing of the operations S2 to S9 is repeated.

One comparator is sequentially selected as a redundant comparator from among the first comparator to the M-th comparator, and the threshold value is updated. The threshold value of the comparator is updated in parallel with the AD conversion by updating the threshold value in the background of the AD conversion.

A comparator is sequentially selected as a redundant comparator, and as illustrated in FIG. 5, the threshold value is updated. As illustrated in FIG. 1 or 2, the threshold value is updated. For example, in an updating period prior to AD conversion, the update of the threshold value may be performed in the foreground without using a redundant comparator. An input voltage may be applied in the updating period, the input voltage may be compared with the threshold value in a certain comparator and the adjacent comparator, and as illustrated in FIG. 9, the comparison results may be compared with each other. When the code of the comparator is changed based on a plurality of comparisons performed while changing the input voltage and the comparison results match each other at a certain ratio or higher, it may be determined that the threshold value of the certain comparator and that of the adjacent comparator are substantially the same as each other. The value obtained by multiplying the difference between the code of the certain comparator at this time and the initial code of the certain comparator by r may be added to the initial code threshold value, and the threshold value may be updated. As illustrated in FIG. 1 or 2, the threshold value may be updated. The threshold values of the comparators may be sequentially updated, or the comparison results of a plurality of comparators, for example, the second comparator 12 and the fourth comparator 14 illustrated in FIG. 1, may be compared with the comparison result in the adjacent comparator. For example, the updated digital codes of the second comparator 12 and the fourth comparator 14 may be stored in a register or the like in the control circuit 22, and the initial digital code may be set in the comparator. After the third comparator 13 is compared with the adjacent comparator and the digital code is updated, the threshold values of the second to fourth comparators may be updated.

Figure 12:
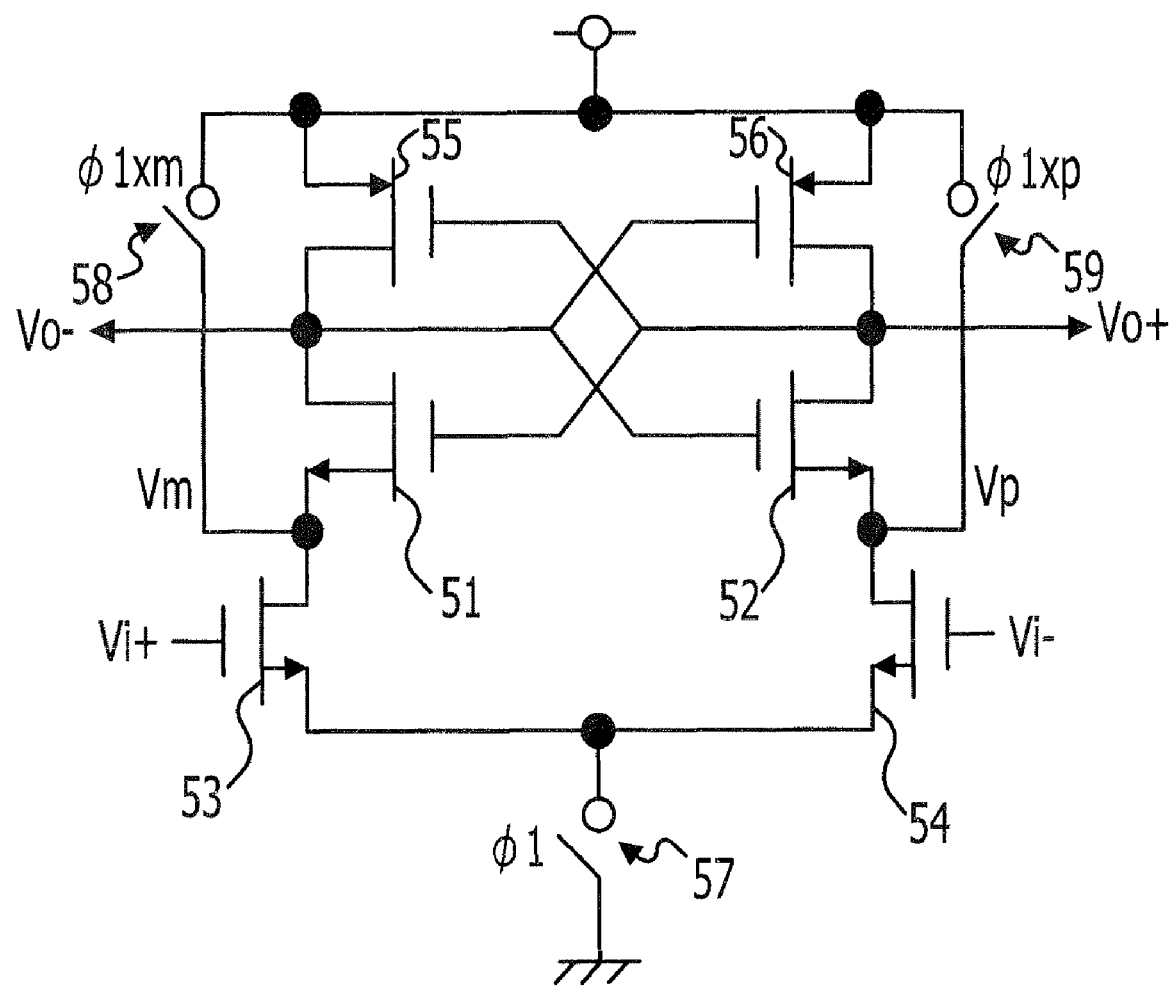
FIG. 12 illustrates an exemplary comparator.

FIG. 12 illustrates an exemplary comparator. A comparator illustrated in FIG. 12 includes NMOS transistors 51 to 54, PMOS transistors 55 and 56, and switch circuits 57 to 59. When the switch circuit 57 becomes conductive and the switch circuits 58 and 59 do not become conductive, the comparator starts to perform comparison. Since timings when the switch circuits 58 and 59 become non-conductive differ from each other, voltages Vm and Vp of the drain ends of the NMOS transistors 53 and 54 at a differential input stage are controlled according to the timings, and the threshold value is controlled. When a control signal φ1 becomes a high level, a switch circuit 57 becomes conductive. When a control signal φ1xp becomes a low level, the switch circuit 59 becomes non-conductive. When a control signal φ1xm becomes a low level, a switch circuit 58 becomes non-conductive.

Figure 13:
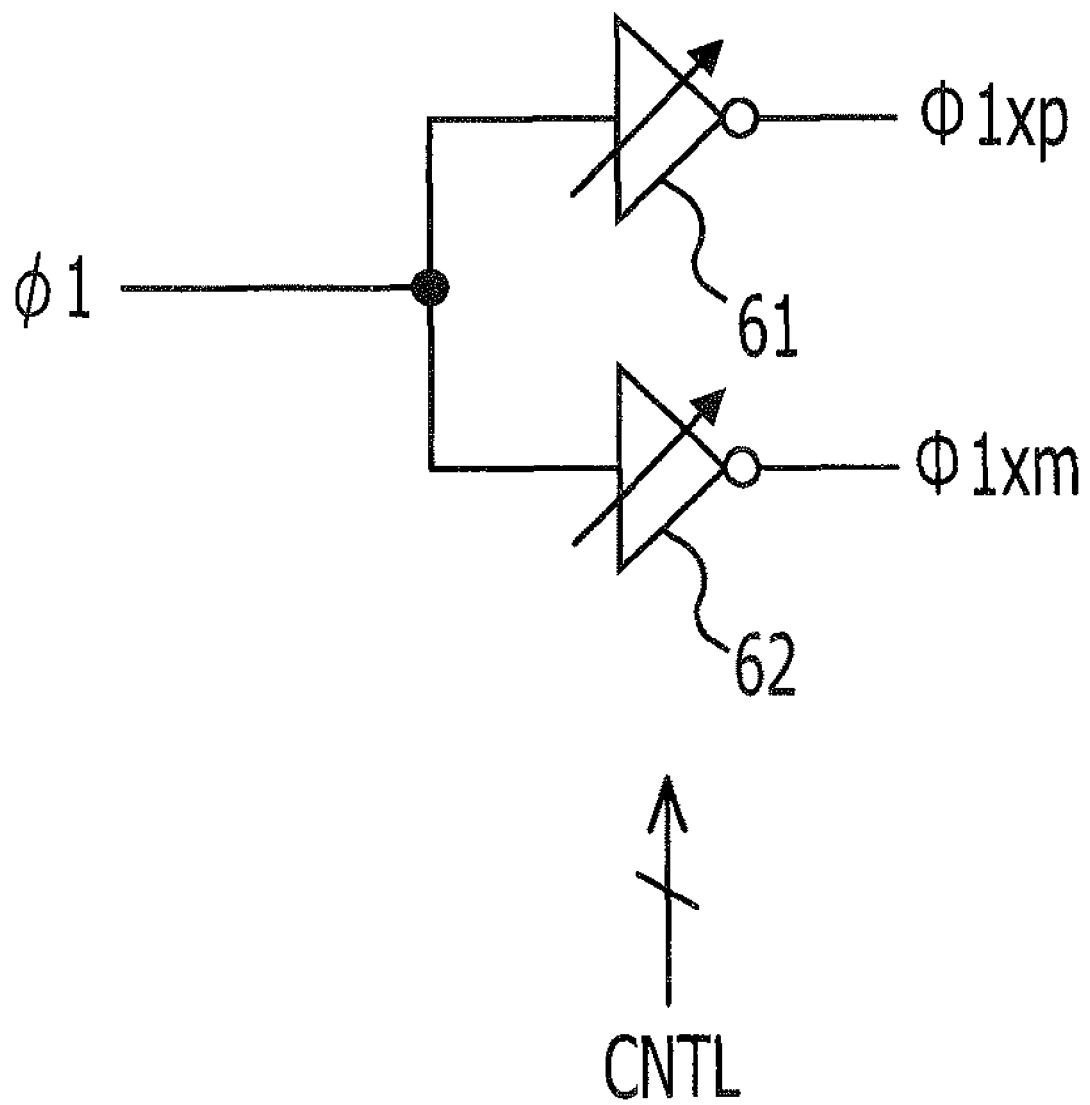
FIG. 13 illustrates an exemplary control signal generation circuit.

FIG. 13 illustrates an exemplary control signal generation circuit. The control signal generation circuit illustrated in FIG. 13 includes inverters 61 and 62 that control a signal transition rate in accordance with a control signal CNTL, and generates a control signal φ1xp and a control signal φ1xm based on the control signal φ1.

Figure 14A:
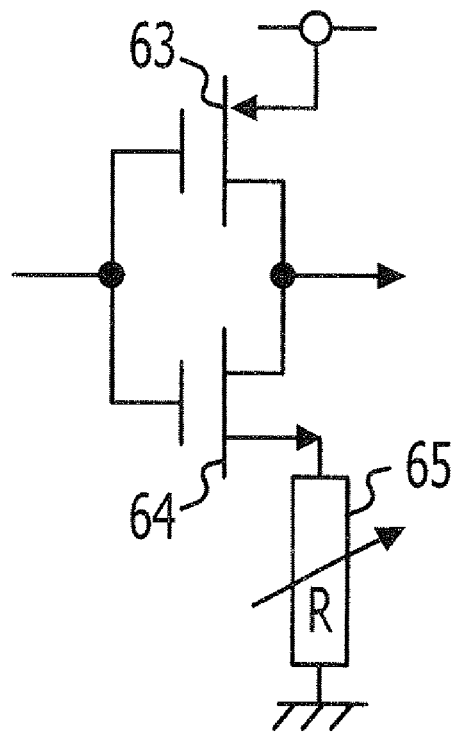
FIGS. 14A and 14B illustrate an exemplary inverter.
Figure 14B:
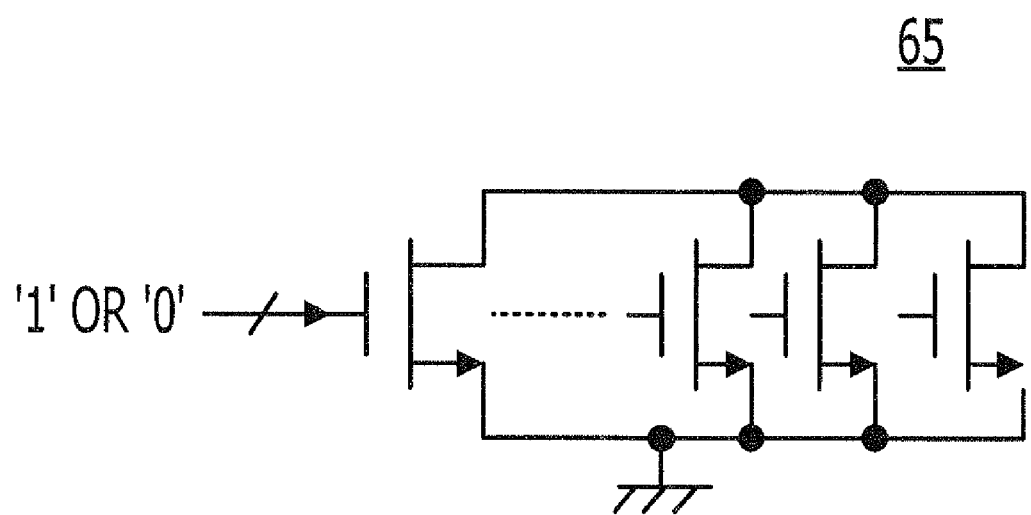

FIGS. 14A and 14B illustrate an exemplary inverter. The inverter illustrated in FIG. 14A controls a signal transition rate in accordance with a control signal. The inverter illustrated in FIG. 14A includes an inverter circuit including a PMOS transistor 63 and an NMOS transistor 64, and a variable resistor 65. For example, as illustrated in FIG. 14B, the variable resistor 65 generates a certain resistance by applying a control signal 1 or 0 to the gate ends of a certain number of NMOS transistors coupled in parallel with each other to make the NMOS transistors become conductive.

Figure 15A:
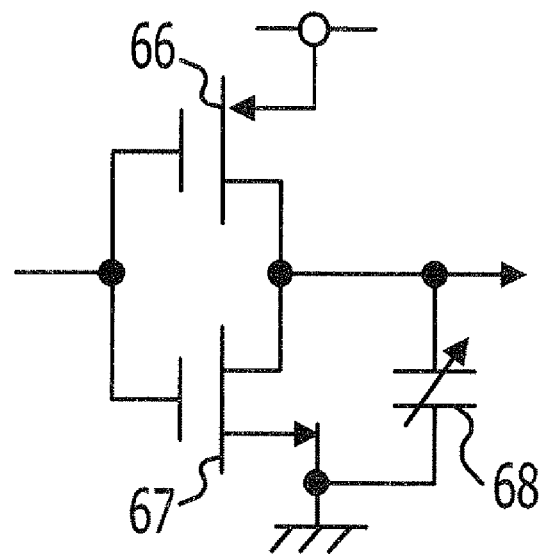
FIGS. 15A and 15B illustrate an exemplary inverter.
Figure 15B:
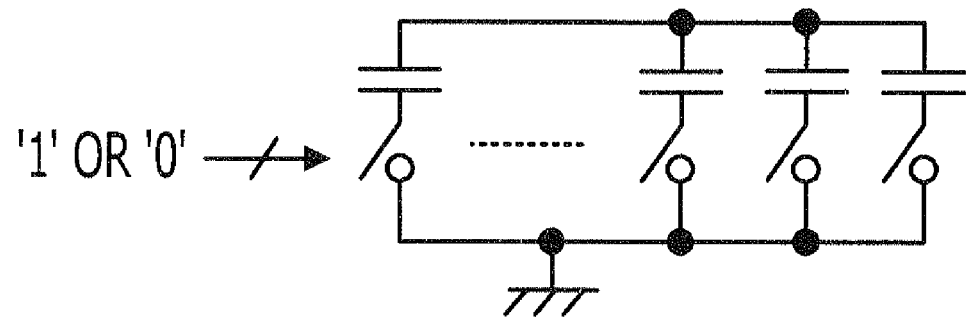

FIGS. 15A and 15B illustrate an exemplary inverter. The inverter illustrated in FIG. 15A controls a signal transition rate in accordance with a control signal. The inverter illustrated in FIG. 15A includes an inverter circuit including a PMOS transistor 66 and an NMOS transistor 67, and a variable capacitance 68. As illustrated in FIG. 15B, the variable capacitor 68 generates a certain capacitance by applying a control signal 1 or 0 to a certain number of capacitance elements and switch circuits coupled in parallel with each other to make the switch circuits become conductive.

Figure 16:
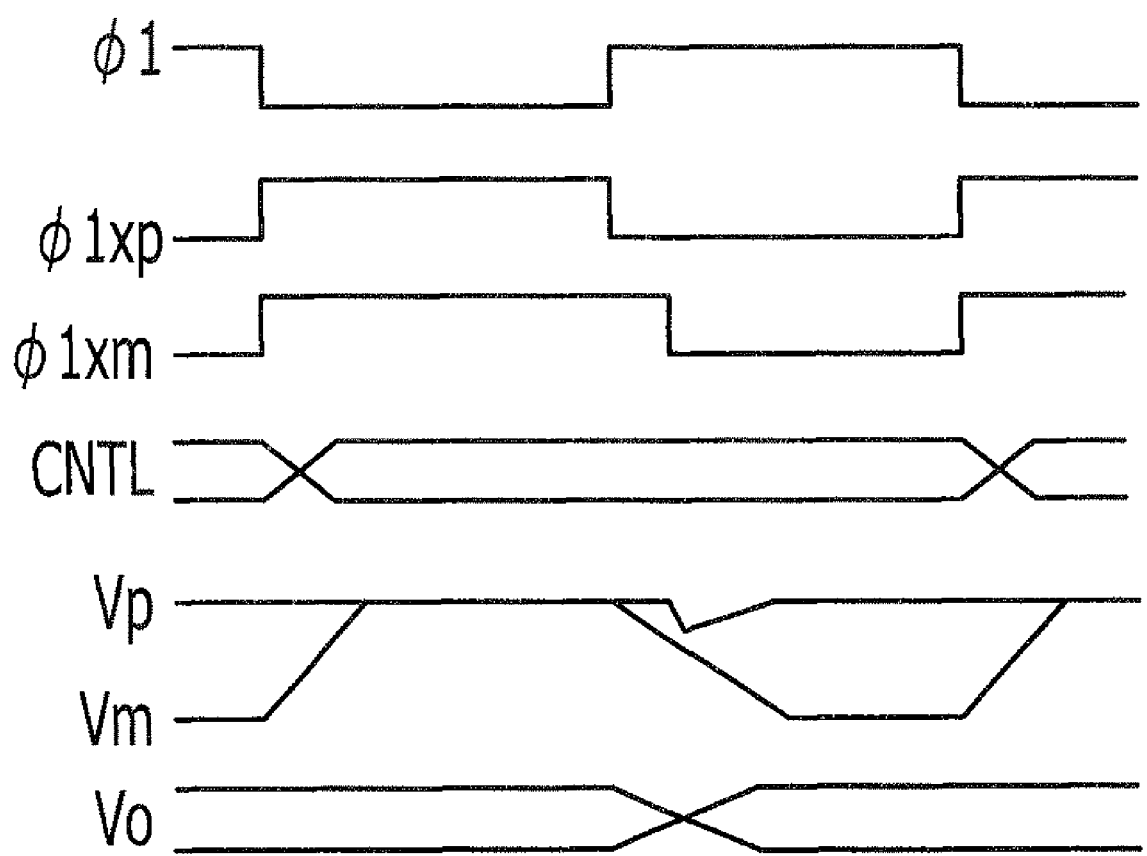
FIG. 16 illustrates an exemplary operation of a comparator.

FIG. 16 illustrates an exemplary operation of a comparator. The comparator illustrated in FIG. 16 may be a comparator illustrated in FIG. 12. When the control signal φ1 becomes a high level, the switch circuit 57 becomes conductive. The control signal φ1xp becomes a low level, the switch circuit 59 becomes non-conductive. When the control signal φ1xm goes to a low level, the switch circuit 58 becomes non-conductive. In FIG. 16, after the control signal φ1xp becomes a low level, the control signal φ1xm becomes a low level. The timing difference may be controlled in accordance with a control signal CNTL, for example, a signal 1 or 0, which is illustrated in FIG. 14B or 15B. Since the control signal φ1xm becomes a low level after the control signal φ1xp becomes a low level, a voltage Vp starts decreasing earlier than a voltage Vm. As a result, when the inputs Vi+ and Vi− of the comparator illustrated in FIG. 16 has the relation Vi+>Vth+Vi−, outputs Vo+ and Vo− become a high level and a low level, respectively. The voltage Vth may be a threshold value. For example, when timings at which the control signal φ1xp and the control signal φ1xm becomes a low level are substantially the same and Vi+>Vi−, the outputs Vo+ and Vo− become a high level and a low level, respectively. As illustrated in FIG. 16, since the control signal φ1xp and the control signal φ1xm have a timing difference, a threshold value Vth corresponding to the timing difference is set.

Figure 17:
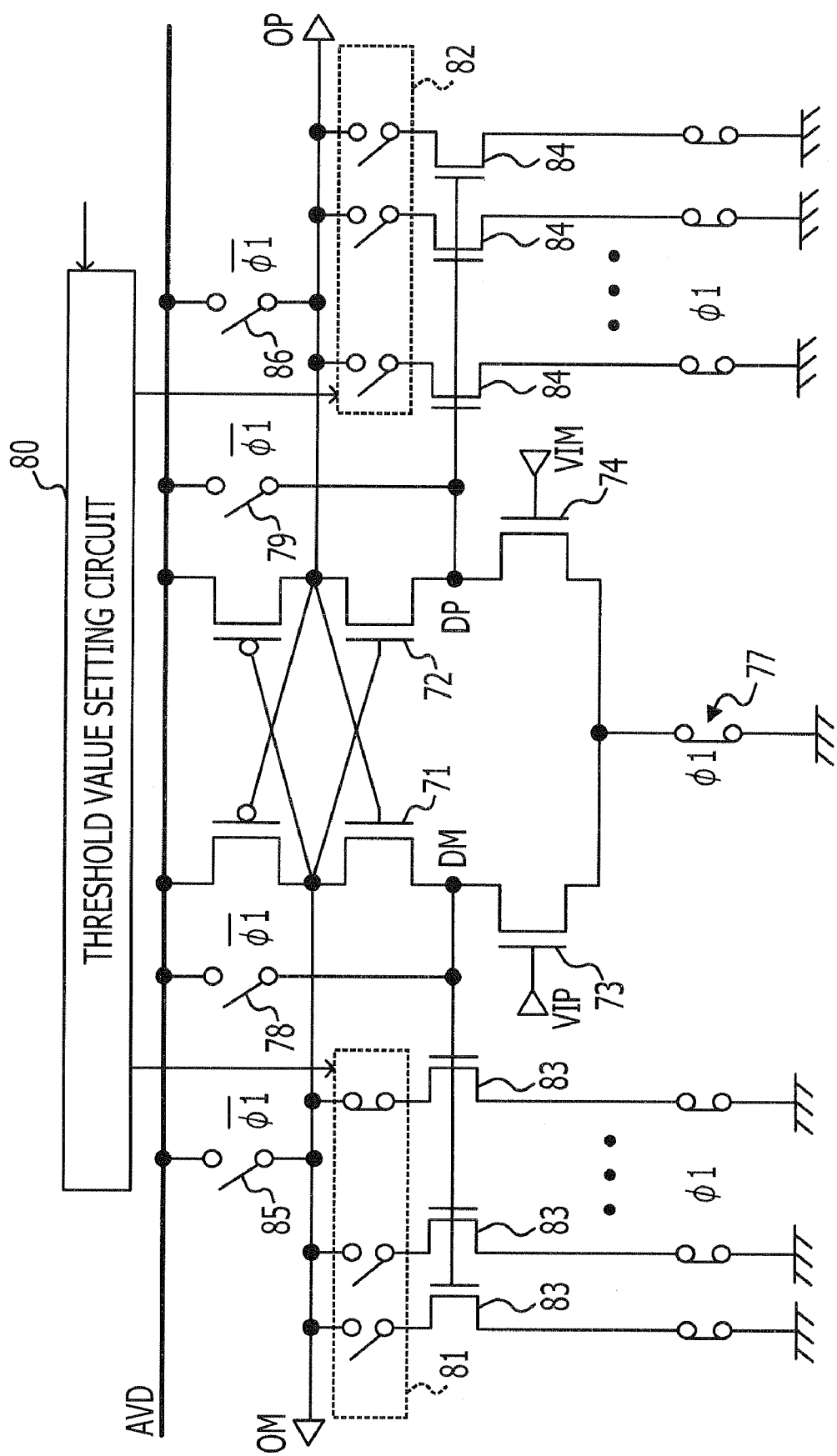
FIG. 17 illustrates an exemplary comparator.

FIG. 17 illustrates an exemplary comparator. The comparator illustrated in FIG. 17 includes NMOS transistors 71 to 74, PMOS transistors 75 and 76, and switch circuits 77 to 79. The comparator includes a threshold value setting circuit 80, switch circuits 81 and 82, a plurality of NMOS transistors 83, a plurality of NMOS transistors 84, and switch circuits 85 and 86. The switch circuit 77 becomes conductive and the switch circuits 78 and 79 become non-conductive, and then a comparison circuit starts making a comparison. At this time, electric current may flow through the switch circuit 81 and the NMOS transistor 83, and electric current may flow through the switch circuit 82 and the NMOS transistor 84. By adjusting the number of conduction switches of the switch circuit 81 and the number of conduction switches of the switch circuit 82, the amount of electric current is controlled, and the threshold value is controlled. The number of conduction switches of the switch circuits 81 and 82 is controlled by the threshold value setting circuit 80. When the control signal φ1 is at a low level, the switch circuit 77 becomes non-conductive, and the switch circuits 78, 79, and 85 become conductive. When the control signal φ1 is at a high level, the switch circuit 77 becomes conductive, the switch circuits 78, 79, 85, and 86 become non-conductive, and a comparison is started.

Figure 18:
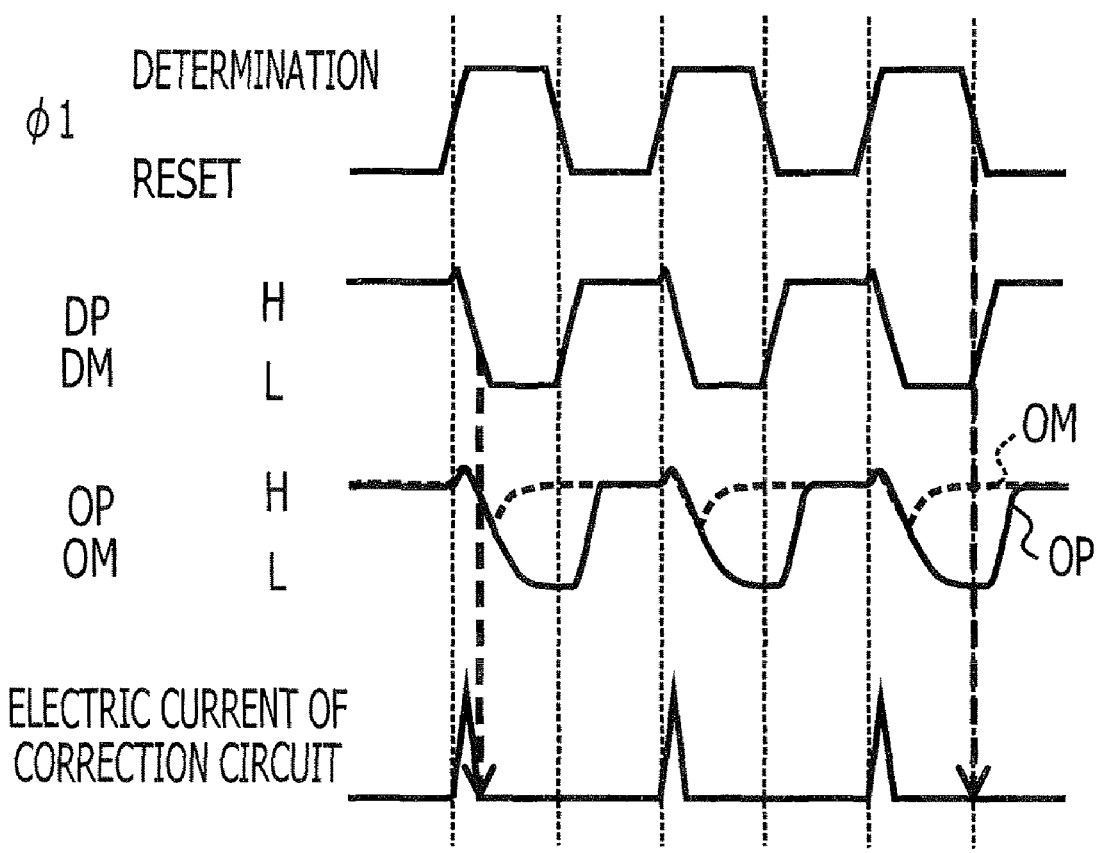
FIG. 18 illustrates an exemplary comparison operation.

FIG. 18 illustrates an exemplary comparison operation. The comparator illustrated in FIG. 18 may be the comparator illustrated in FIG. 17. When the control signal φ1 is at a low level, the comparator is reset, and when the control signal φ1 becomes a high level, a comparison is started. When the comparison is started, the voltages DM and DP at the drain ends of the NMOS transistors 73 and 74 of a differential input stage, which are illustrated in FIG. 17, drop from a high level. When the voltages DM and DP are higher than the threshold value voltages of the NMOS transistors 83 and 84, electric current flows through the switch circuit 81 and the NMOS transistor 83, and also electric current flows through the switch circuit 82 and the NMOS transistor 84. When the voltages DM and DP are decreased to less than the threshold value voltages of the NMOS transistors 83 and 84, electric current may not flow. The electric current may flow in a direction in which the outputs OP and OM of the comparator are pulled to the ground. Since the number of conduction switches of the switch circuit 81 differs from the number of conduction switches of the switch circuit 82, one of the outputs OP and OM may be pulled toward the ground more strongly than the other.

Since the number of conduction switches of the switch circuit 81 and the number of conduction switches of the switch circuit 82 are controlled, for example, the outputs OP and OM become a high level and a low level respectively when the inputs VIP and VIM of the comparator is VIP>Vth+VIM. The voltage Vth may be a threshold value. For example, when the number of conduction switches of the switch circuit 81 and that of the switch circuit 82 are substantially the same as each other and VIP>VIM, the outputs OP and OM become a high level and a low level, respectively. Since the number of conduction switches of the switch circuit 81 differs from the number of conduction switches of the switch circuit 82, a threshold value Vth corresponding to the difference of the numbers of conduction switches is set.

Figure 19:
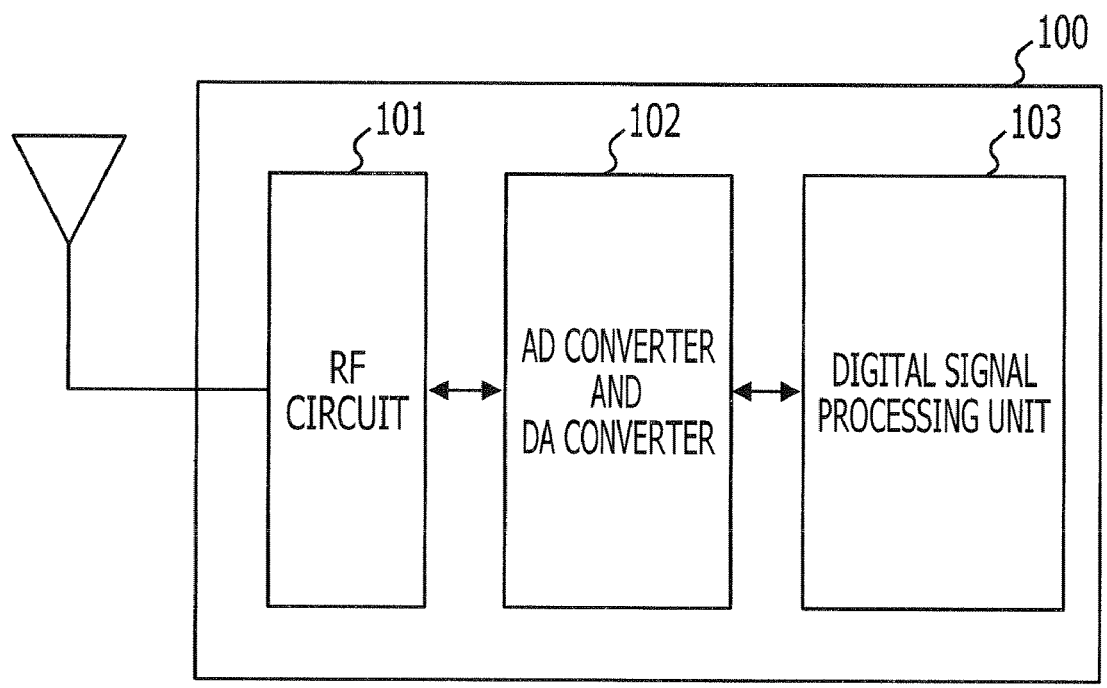
FIG. 19 illustrates an exemplary communication apparatus.

FIG. 19 illustrates an exemplary communication apparatus. A communication apparatus 100 illustrated in FIG. 19 includes an RF circuit 101, an AD and DA conversion circuit 102, and a digital signal processing circuit 103. The digital signal processing unit 103 includes a synchronization circuit, a demodulation circuit, a modulation circuit, an error correction circuit, a coding circuit, and the like. The RF circuit 101 converts a received RF signal into a modulation signal. After the AD and DA conversion circuit 102 converts the modulation signal from digital into analog signal, the digital signal processing unit 103 performs a certain process. The AD and DA conversion circuit 102 may include the AD converter described above.

For example, when r of the AD converter that operates as illustrated in FIG. 1 or 4 is 0.1, the threshold value of each comparator continues to increase/decrease at an amplitude of approximately 0.1 times the difference with the adjacent threshold value. For this reason, when the threshold value of each comparator is converted to a certain threshold value, an error of approximately 0.1 times the difference with the adjacent threshold value may remain. It is similar when, for example, r of the AD converter that operates as illustrated in FIG. 5 is 0.9. When r is set to a small value, for example, 0.01, the error may become smaller. However, the conversion time period may take a longer time.

The threshold values of the comparators at both ends, for example, the threshold value of the comparator 11 and the threshold value of the comparator 15, may be set to certain threshold values.

The threshold value of the M-th (1<M<5) comparator, for example, the comparator other than at both sides among the first to fifth comparators 11 to 15, is set to $TH_M$. In the order of the arrangement of the first to fifth comparators 11 to 15, the threshold value of the (M−1)th comparator in the vicinity of the M-th comparator is set to $TH_{M-1}$, and the threshold value of the (M+1)th comparator in the vicinity of the M-th position is set to $TH_{M+1}$. The updated threshold value of the M-th comparator may be set to an average value between the threshold value of the (M−1)th comparator and the threshold value of the (M+1)th comparator. For example, the updated threshold value of the M-th comparator may be set to $(TH_{M-1}+TH_{M+1})/2$. The threshold values of the comparators 12 to 14 are updated. The update of the threshold value is repeated a plurality of times, and the threshold values of the comparators 12 to 14 are set in such a manner that the interval between the threshold value of the comparator 11 and the threshold value of the comparator 15 is divided into substantially equal intervals.

The average value of the threshold value of the (M−1)th comparator and the threshold value of the (M+1)th comparator, which are positioned before and after the M-th comparator, is set to the updated threshold value of the M-th comparator. The threshold value may be updated to the weighted average value of the threshold values of a plurality of comparators in the vicinity of the M-th comparator in the order of the arrangement of the first to N-th comparators. For example, the average value of the threshold value of the (M−1)th comparator, the threshold value of the M-th comparator, and the threshold value of the (M+1)th comparator in the vicinity of the M-th comparator may be set to the threshold value. For example, when the threshold value of the (M−1)th comparator is set to $TH_{M-1}$, the threshold value of the M-th comparator is set to $TH_M$, and the threshold value of the (M+1)th comparator is set to $TH_{M+1}$, the M-th comparator threshold value may be updated to $(TH_{M-1}+TH_M+TH_{M+1})/3$.

For example, the average value of the threshold values of (M−2)th, (M−1)th, M-th, (M+1)th, and (M+2)th comparators in the vicinity of the M-th comparator may be set to the threshold value of the M-th comparator. For example, the average value of the threshold values of the (M−2)th, M-th, and (M+2)th comparators in the vicinity of the M-th comparator may be set to the threshold value of the M-th comparator. For example, the average value of the threshold values of the (M−2)th and (M+2)th comparators in the vicinity of the M-th comparator may be set to the threshold value of the M-th comparator. A plurality of comparators in the vicinity of the M-th comparator may include, for example, at least two comparators among the M-th comparator, the (M−1)th comparator, the (M+1)th comparator, ..., the (M−k)th comparator, and the (M+k)th comparator. Since the change in the ease of convergence is continuous, a neighborhood area corresponding to convergence conditions may not be defined.

Since the threshold value of the M-th comparator is set to, for example, the average value of the threshold values of the comparators that are positioned before and after the M-th comparator, the threshold value is updated in such a manner that the threshold value intervals between the M-th comparator and the comparators that are positioned before and after the M-th comparator become substantially equal to one another. For example, since the threshold value intervals become substantially equal to one another by the update, the threshold value intervals from the first comparator to the fifth comparator are substantially changed to a certain value. For example, the threshold values of the comparators 11 to 15 are arranged at substantially equal intervals between the low end threshold value and the upper end threshold value.

The average of the threshold values of the plurality of comparators may be a weighted average.

In the threshold value setting illustrated in FIG. 1, in the first update, $(TH_{M+1}-TH_M)$ multiplied by r is added to $TH_M$, and the threshold value is updated. In the second update, $(TH_{M-1}-TH_M)$ multiplied by r is added to $TH_M$, and the threshold value is updated. The first update may correspond to $(TH_{M+1}-TH_M)r+TH_M=r\cdot TH_{M+1}+(1-r)\cdot TH_M$, and the updated threshold value may be a weighted average value of the threshold values of a plurality of comparators in the vicinity of the M-th comparator. The updated threshold value in the second update may be a weighted average value of the threshold values of a plurality of comparators in the vicinity of the M-th comparator. In a normal average, the weights of a plurality of threshold values when weighted-averaging is performed become substantially the same as one another.

The relation between the input voltage and the output digital code of the application of the AD converter may not have linear characteristics and may have curved characteristics. For example, in order to correct gamma characteristics of a display device arranged at a subsequent stage, curve characteristics that compensate for gamma characteristics may be supplied to the AD converter. For example, in order to correct the characteristics of a sensor that is arranged at a previous stage, curve characteristics that compensate for the sensor characteristics may be supplied to the AD converter. When the threshold values $TH_{M-1}$ and $TH_{M+1}$ of two comparators that are positioned before and after the M-th comparator are used to update the threshold value, the threshold value of the M-th comparator may be set to a weighted average value $r\cdot TH_{M-1}+(1-r)\cdot TH_{M+1}$ rather than being set to the average value $(TH_{M-1}+TH_{M+1})/2$. The coefficient r may be greater than 0 and smaller than 1. Since different weighted coefficients r are set to a plurality of comparators (M=2, 3, 4 . . . ), the intervals of the threshold values of the plurality of comparators (M=2, 3, 4 . . . ) may be different. For example, when the threshold value of the M-th comparator is updated to the weighted average value of the threshold values of a plurality of comparators in the vicinity of the M-th comparator, different weights are set to the plurality of comparators. For example, regarding a ratio of weights of a threshold value on which weighted-averaging is performed, for example, r:(1−r), M of a first value, for example, a third threshold value, differs from M of a second value, for example, a fourth threshold value. For this reason, the relation between the input voltage and the output digital code of the AD converter is set as curved characteristics.

In FIG. 5, the sixth comparator 16 may be a redundant comparator. When the threshold value of the fifth comparator 15 is updated, the fifth comparator 15 is coupled to the encoder, and a comparator selected from among the remaining plurality of comparators 11 to 15 is disconnected from the encoder, and the threshold value is updated. For example, the fourth comparator 14 may be disconnected from the encoder, and the threshold value may be updated. While the threshold value is updated, the comparators 11, 12, 13, 15, and 16 perform AD conversion.

The threshold value of the M-th comparator is updated to the weighted average value of the threshold values of a plurality of comparators in the vicinity of the M-th comparator. For example, the threshold value of the M-th comparator may be set to the average value of the threshold value of the M-th comparator and the threshold value of the (M−2)th comparator. For example, the threshold value of the M-th comparator after update may be set to $(TH_{M-2}+TH_M)/2$. For example, the threshold value of the fifth comparator 15 may be updated to $(TH_3+TH_5)/2$. Since the fifth comparator 15 is replaced with the fourth comparator 14 as illustrated in FIG. 5 when the threshold value of the fifth comparator 15 is updated, the average value of $TH_3$ and $TH_5$ rather than the average value of $TH_4$ and $TH_6$ may be used. The fifth comparator 15 may be replaced with the fourth comparator to be coupled to the encoder, and the threshold value $TH_4$ of the fourth comparator may be updated to the average value $(TH_3+TH_5)/2$ of the threshold values. For example, in FIG. 5, the comparator corresponding to the threshold value 3 may be the fourth comparator 14 in the initial state. The fourth comparator 14 may be replaced with the fifth comparator 15, and thereafter the fifth comparator 15 may be replaced with the fourth comparator 14. The arrows of the dotted lines illustrated in FIG. 5 indicate changes in the threshold value of each comparator. The arrows of the solid lines indicate transitions of the replacements of the comparators corresponding to a certain threshold value.

The fourth comparator 14 to be replaced with the fifth comparator 15 is disconnected from the encoder, and the threshold value is updated. When the threshold value of the fourth comparator 14 is updated, the fourth comparator 14 is replaced with the third comparator 13. The third comparator 13 that is replaced with the fourth comparator 14 is disconnected from the encoder, and the threshold value is updated. When the threshold value of the third comparator 13 is updated, the third comparator 13 is replaced with the second comparator 12. The second comparator 12 is disconnected from the encoder, and the threshold value is updated. The threshold value $TH_2$ of the second comparator 12 may be substantially equally set to the threshold value $TH_1$ of the first comparator 11. The threshold values of the comparators 11 to 16 are updated. The threshold values of the comparators 11 and 16 that are positioned at both ends may be set to, for example, 0 and 4, respectively.

The threshold value of the M-th comparator may be updated to the average value of the threshold value of the M-th comparator and the threshold value of the (M+2)th comparator. For example, the updated threshold value of the M-th comparator may be set to $(TH_{M+2}+TH_M)/2$. For example, the threshold value of the second comparator 12 may be updated to $(TH_4+TH_2)/2$. When the update of the threshold value of the second comparator 12 is completed, the second comparator 12 is replaced with the third comparator 13. The replaced third comparator 13 is disconnected from the encoder, and the threshold value is updated. The threshold values of the comparators 13 to 15 may be sequentially updated.

The threshold value may be updated to, for example, an average value of the threshold values of three comparators in the vicinity of the M-th comparator. For example, the average value of the threshold values of four or more comparators in the vicinity of the M-th comparator may be set as the threshold value of the M-th comparator. For example, the average value of the threshold values of a plurality of comparators, which are located away from the M-th comparator by one or more comparators rather than a neighboring comparator may be set as the threshold value of the M-th comparator. In order to obtain curve characteristics, the threshold value may be updated using a weighted average rather than a simple average, and the weight coefficient may be different depending on the position of the comparator.

The AD conversion circuit and the encoder, which are illustrated in FIGS. 6 and 7, may set the updated threshold value of the M-th comparator to a weighted average value of the threshold values of a plurality of comparators in the vicinity of the M-th comparator. The configuration of the control circuit may be changed according to the number and positions of comparators.

Figure 20:
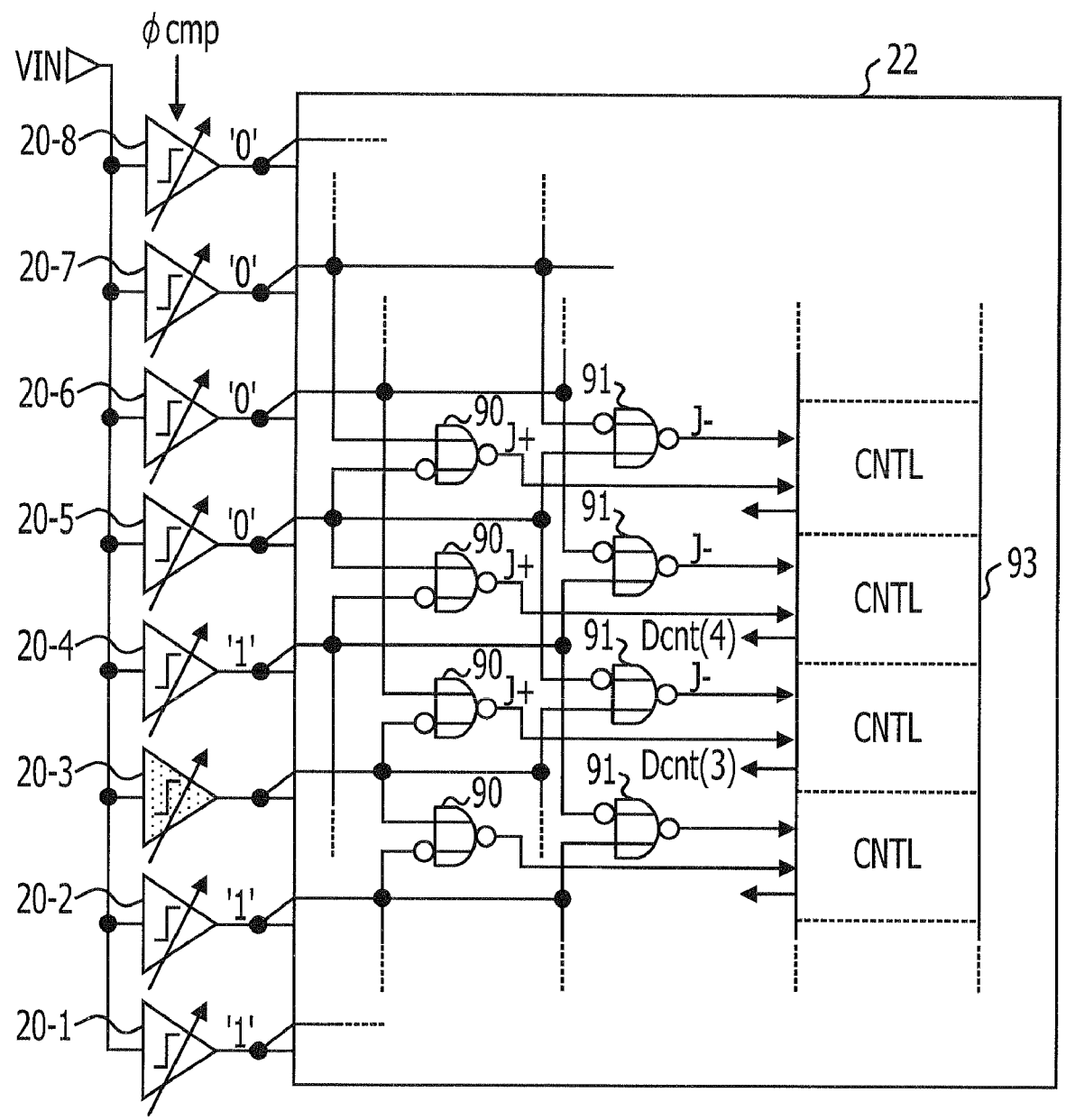
FIG. 20 illustrates an exemplary control circuit.

FIG. 20 illustrates an exemplary control circuit. A control circuit 22 illustrated in FIG. 20 updates the threshold value of a redundant comparator. The updated threshold value of the M-th comparator may be set to $(TH_{M+2}+TH_M)/2$. The control circuit 22 includes a plurality of NOR gates 90 whose low-order-side input of two inputs is a negative logical input, a plurality of NOR gates 91 whose high-order-side of two inputs is a negative logical input, and a control logic circuit 93. One NOR gate 90 and one NOR gate 91 form a pair, and each of pairs of NOR gates receives outputs of two comparators having one comparator held therebetween in eight comparators 20-1 to 20-8. Since the number of combinations of two comparators where one comparator among the comparators 20-1 to 20-8 is arranged therebetween is six, six pairs of NOR gates may be provided. FIG. 20 illustrates four pairs of NOR gates.

The outputs of the comparators 20-1 to 20-8 are supplied to the encoder 21 and the control circuit 22. A pair of NOR gates, which are provided with respect to two comparators where one comparator is arranged therebetween, determine whether or not the input voltage VIN is greater than or smaller than two threshold values of two comparators or intermediate between them. The third comparator 20-3 may be a redundant comparator, and the threshold value of the redundant comparator may be updated.

When the input voltage VIN is lower than the threshold value of the third comparator 20-3 and the threshold value of the fifth comparator 20-5, the output J+ of the corresponding NOR gate 90 and the output J− of the corresponding NOR gate 91 may be 0. When the input voltage VIN is higher than the threshold value of the third comparator 20-3 and the threshold value of the fifth comparator 20-5, the output J+ of the corresponding NOR gate 90 and the output J− of the corresponding NOR gate 91 may be 0. When the output J+ and the output J− are 0, the control logic circuit 93 may not operate.

When the input voltage VIN is between the threshold value of the third comparator 20-3 and the threshold value of the fifth comparator 20-5, the output J+ and the output J− of the corresponding NOR gates change according to the magnitude relationship between the threshold value $TH_3$ of the third comparator 20-3 and the threshold value $TH_5$ of the fifth comparator 20-5. Since the outputs of the third comparator 20-3 and the fifth comparator 20-5 become 1 and 0 respectively when $TH_3<TH_5$, the output J+ of the NOR gate 90 and the output J− of the NOR gate 91 become 1 and 0, respectively. The threshold value $TH_3$ of the third comparator 20-3 is increased at a minimum step width by increasing the digital code Dcnt(3) of the third comparator 20-3 by 1 by the control logic circuit 93. Consequently, $TH_3$ approaches $TH_5$. Since the outputs of the third comparator 20-3 and the fifth comparator 20-5 become 0 and 1 respectively when $TH_3>TH_5$, the output J+ of the NOR gate 90 and the output J− of the NOR gate 91 become 0 and 1, respectively. The threshold value $TH_3$ of the third comparator 20-3 is decreased at a minimum step width by decreasing the digital code Dcnt(3) of the third comparator 20-3 by 1 by the control logic circuit 93. Consequently, $TH_3$ approaches $TH_5$. The input analog voltage VIN that is input to the AD converter is compared with the threshold value, and the threshold value of the third comparator 20-3 is changed in accordance with the comparison result.

When $TH_3$ becomes equal to $TH_5$, the output J+ of the NOR gate 90 and the output J− of the NOR gate 91 become 0 regardless of the value of the input analog voltage VIN. For example, the output J+ and the output J− may become 0 in the comparison between the input analog voltage VIN and the threshold value, which is performed 1000 times. When $TH_3$ and $TH_5$ do not substantially match each other even when various digital codes Dcnt(3) are set, for example, when there is a difference corresponding to the minimum resolution of each comparator, the output J+ and the output J− may be different from each other. For example, when the output J+ and the output J− match each other, for example, the outputs become 0, at a certain ratio or higher, for example, at 99.5% or higher in the 1000 comparisons, it may be determined that $TH_3$ and $TH_5$ become substantially equal to each other, and $TH_3$ may be updated. When the output J+ and the output J− become equal to each other continuously a certain number of times or more, for example, the outputs become 0 continuously the certain number of times or more, it may be determined that $TH_3$ and $TH_5$ have substantially become equal to each other, and $TH_3$ may be updated. By adding 0.5 times the difference between the digital code when $TH_3$ and $TH_5$ become substantially equal to each other and the initial digital code to the first digital code, the threshold value may be updated. A value $0.5(TH_5-TH_3)$ is added to $TH_3$, and the threshold value of the third comparator is updated to $(TH_5+TH_3)/2$.

When $TH_3$ is updated, the third comparator 20-3 is coupled to the encoder 21, and the fourth comparator 20-4 is disconnected from the encoder 21. The fourth comparator 20-4 is set as a redundant comparator, and the threshold value of the fourth comparator 20-4 is updated. Similarly, by referring to the threshold value of the comparator on the low side, for example, the third comparator 20-3, the threshold value of the comparator on the upper side, for example, the fifth comparator 20-5, may be updated.

A plurality of comparators of the AD converter illustrated in FIG. 20 may perform an update illustrated in FIG. 11. In the operation S1, a digital code is set in each comparator. In the operation S2, a variable M is initialized to 2. In the operation S3, it is determined whether or not the variable M is equal to the total number m of comparators. When the variable M is not equal, the process proceeds to the operation S4. In the operation S4, the update of the threshold value illustrated in FIG. 20 is performed on the M-th comparator. The threshold value of a comparator adjacent to the comparator at the end, for example, the (M−1)th comparator, may be set to the threshold value of the comparator at the end, for example, the threshold value of the M-th comparator. When the threshold value of the M-th comparator is updated, in the operation S5, the variable M is set to M+1 (M=M+1), the next comparator is set as a redundant comparator, and the threshold value is updated. The process returns to the operation S3, whereby the threshold value of the next comparator is updated.

When it is determined in the operation S3 that the variable M is equal to the total number m of comparators, the process proceeds to the operation S6. In the operation S6, the variable M is set to m−1 (M=m−1). It is determined in the operation S7 whether or not the variable M is equal to 1. When the variable is not equal, the process proceeds to the operation S8. In the operation S8, as illustrated in FIG. 20, the threshold value of the M-th comparator is updated. The threshold value of the comparator adjacent to the comparator at the end, for example, the second comparator, may be set to, for example, the threshold value of the first comparator. When the threshold value of the M-th comparator is updated, the variable M is set to M−1 (M=M−1) in the operation S9, the next comparator is set as a redundant comparator, and the threshold value is updated. The process returns to the operation S7, whereby the threshold value of the next comparator is updated.

When it is determined in the operation S7 that the variable M is equal to 1, the process proceeds to the operation S2. In the operation S2, the variable M is set to 2 (M=2). The operations S2 to S9 may be repeated.

In FIG. 20, the average value of two threshold values is calculated. Alternatively, the average value of three threshold values may be calculated. For example, when the threshold value of the M-th comparator is to be updated to $(TH_{M+2}+TH_{M+1}+TH_M)/3$, the control circuit may include the NOR gates 40 and 41 illustrated in FIG. 9 and the NOR gates 90 and 91 illustrated in FIG. 20. A first digital code difference corresponding to $(TH_4-TH_3)$ is obtained based on the outputs of the NOR gates 40 and 41 corresponding to the threshold value $TH_3$ of the third comparator 20-3 and the threshold value $TH_4$ of the fourth comparator 20-4. A second digital code difference corresponding to $(TH_5-TH_3)$ is obtained based on the outputs of the NOR gates 90 and 91 corresponding to the threshold value $TH_3$ of the third comparator 20-3 and the threshold value $TH_5$ of the fifth comparator 20-5. ⅓ of the sum of the first digital code difference and the second digital code difference is added to the initial digital code. For example, $((TH_4-TH_3)+(TH_5-TH_3))/3$ is added to $TH_3$. Consequently, the threshold value of the third comparator is updated to $(TH_5+TH_4+TH_3)/2$.

Figure 21:
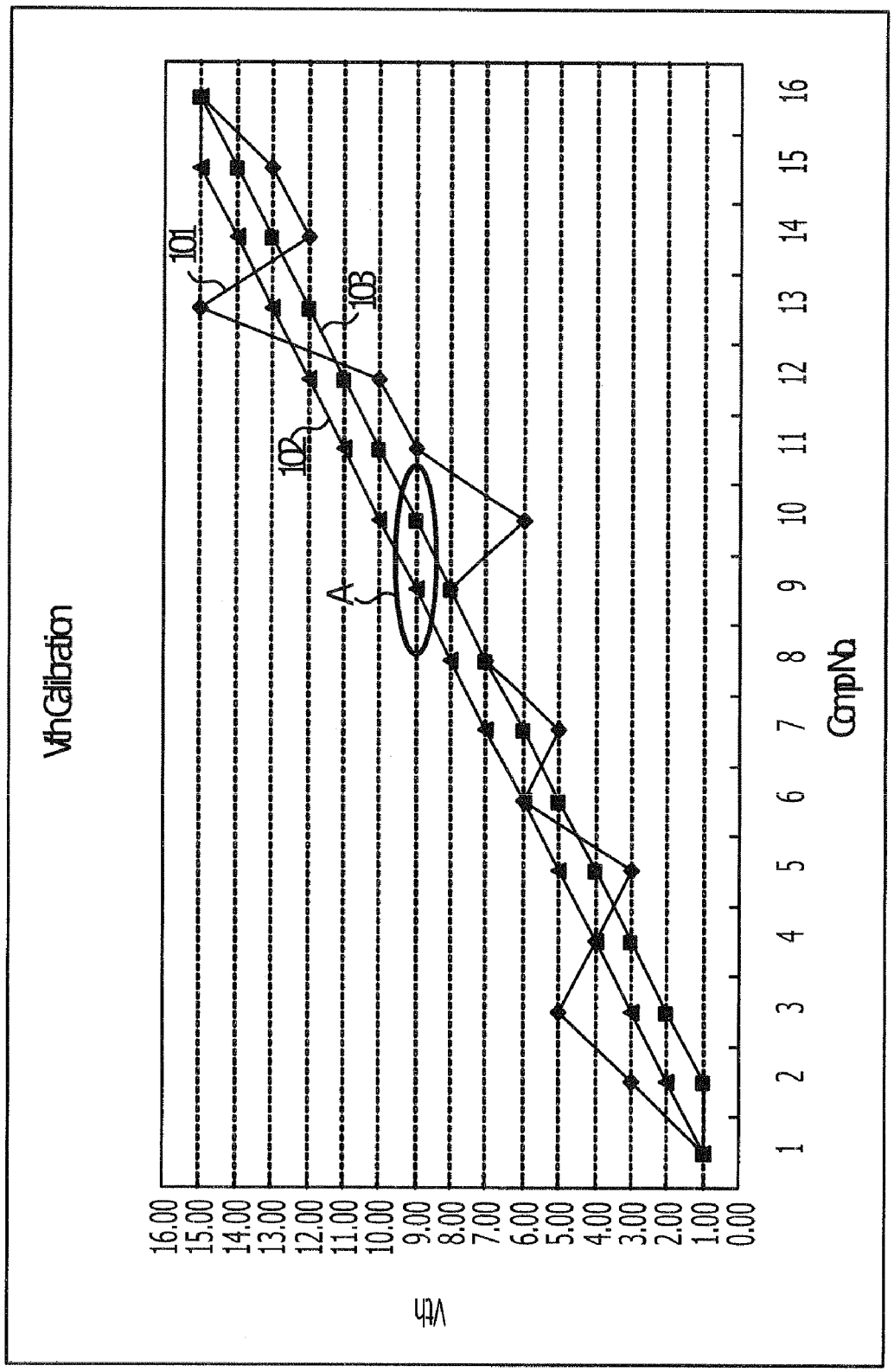
FIG. 21 illustrates exemplary simulation results.

FIG. 21 illustrates exemplary simulation results. The simulation results illustrated in FIG. 21 may be simulation results performed by a computer for a threshold value setting method. The threshold value of the M-th comparator is updated to $(TH_{M-2}+TH_M)/2$, and the threshold value of the M-th comparator is further updated to $(TH_{M+2}+TH_M)/2$. A weight coefficient used for a weighted average may be a certain value, for example, 0.5, regardless of the position of the comparator. The horizontal axis represents the comparator number. The first comparator to the sixteenth comparator are provided. The vertical axis represents the value of the threshold value of the comparator. In simulation, the threshold value may be updated based on the threshold value rather than the threshold value of the comparator in accordance with a digital code. The average value of a plurality of threshold values may be calculated based on the threshold value of the comparator, for example, the threshold value $TH_M$ of the M-th comparator. Since the encoder encodes a thermometer code corresponding to the outputs of a plurality of comparators and outputs a digital code after AD conversion, the horizontal axis that represents the comparator number may correspond to a digital value. FIG. 21 that illustrates the relationship between the comparator number and the threshold value may illustrate characteristics between the input voltage of the AD converter and the digital code.

A characteristic curve 101 illustrated in FIG. 21 indicates a threshold value distribution in an initial state. By sequentially updating the threshold values of the second to fifteenth comparators, the threshold values are arranged in a straight line, and after the update of the threshold value a plurality of times, threshold value distributions illustrated in a characteristic curve 102 and a characteristic curve 103 are obtained. For example, one redundant comparator is provided, and after the threshold value of the redundant comparator is updated, another comparator is replaced with the comparator in which the threshold value has been updated. The threshold value distribution in 16 comparators may be a distribution in the range of 1.00 to 15.00. After the threshold value is updated a plurality of times, the threshold value of one comparator repeats an increase/decrease at a change width of approximately 1.00. For example, the threshold value of the tenth comparator may be changed between approximately 9.00 and approximately 10.00. As indicated by a mark A in FIG. 21, the threshold value of the ninth comparator and the threshold value of the tenth comparator are set to approximately 9.00, and the threshold value for AD conversion may be approximately 9.00. A threshold value up to approximately four digits to the right of the decimal point is quickly set. For example, when the coefficient r of the update is 0.1, there may be no error of approximately 0.1 times the difference with the threshold value of the adjacent comparator.

Figure 22:
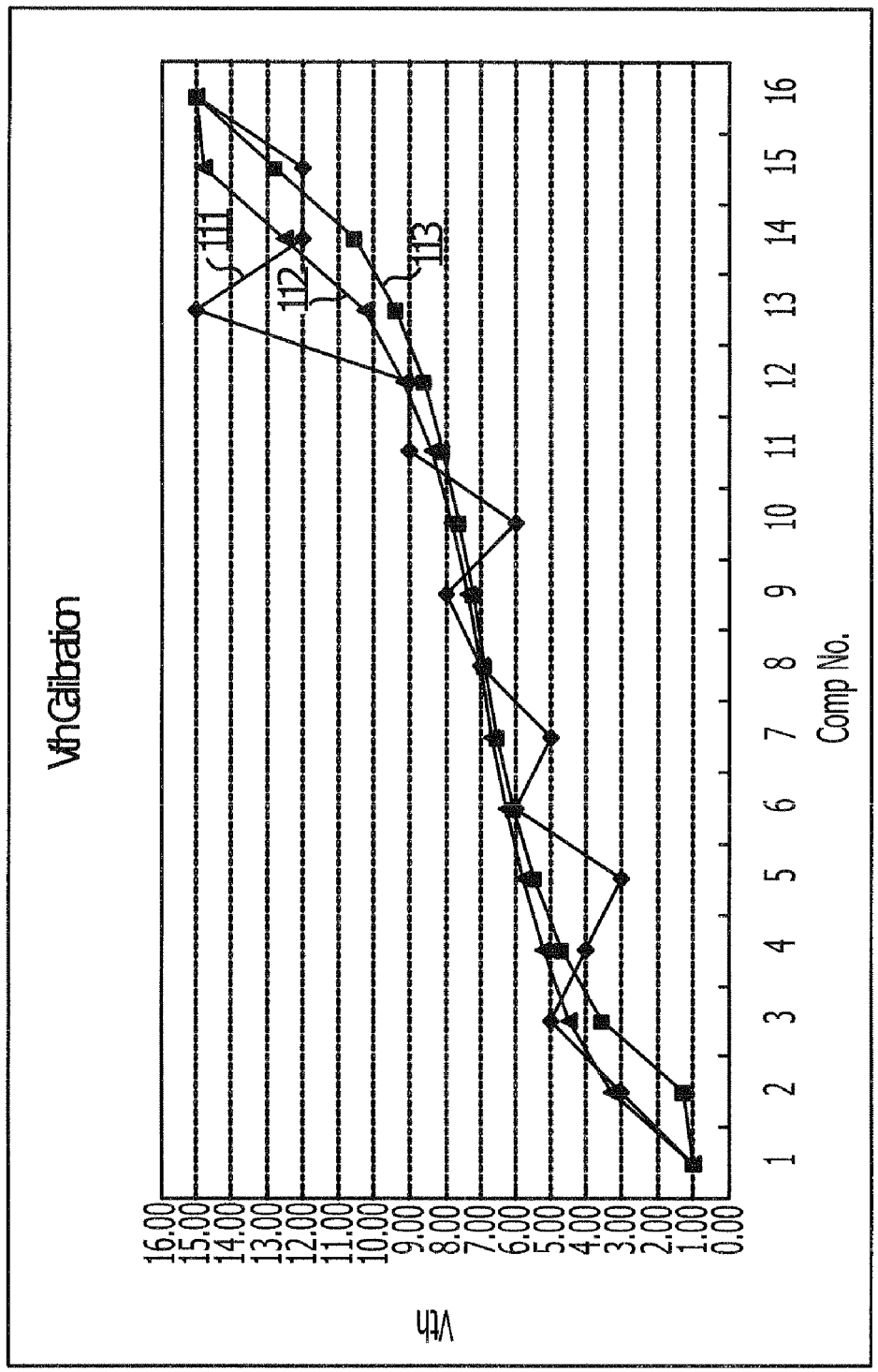
FIG. 22 illustrates exemplary simulation results.

FIG. 22 illustrates exemplary simulation results. The simulation results illustrated in FIG. 22 may be simulation results performed by a computer for a threshold value setting method. The threshold value of the M-th comparator is set to a weighted average value, and the value of the weighted coefficient is changed based on the position of the comparator. For example, the threshold value of the M-th comparator is set to $r \cdot TH_{M-1} + (1-r)TH_M$, and furthermore, the threshold value of the M-th comparator is set to $r \cdot TH_{M+1} + (1-r)TH_M$. The weighted coefficients r for the second to eighth comparators may be 0.9, 0.8, 0.7, 0.6, 0.5, 0.4, and 0.3, respectively. The weighted coefficients r for the ninth to fifteenth comparators may be 0.4, 0.5, 0.6, 0.7, 0.8, 0.9, and 0.9, respectively. In the central portion, the weighted coefficient r may be set small, and in the peripheral portion, the weighted coefficient r may be set large.

A characteristic curve 111 in FIG. 22 indicates a threshold value distribution in the initial state. The threshold values of the second to fifteenth comparators are sequentially updated, and the threshold values are arranged in a straight line manner. The threshold value distributions illustrated in a characteristic curve 112 and a characteristic curve 113 are obtained by a plurality of updates of the threshold value. For example, one redundant comparator is provided, and after the threshold value of the redundant comparator is updated, another comparator is replaced with the comparator in which the threshold value has been updated. The threshold value distribution of 16 comparators may be a distribution in the range of 1.00 to 15.00. In the central portion, the weighted coefficient is set small, and in the peripheral portion, the weighted coefficient is set large. Consequently, the characteristic curves 112 and 113 between the input voltage of the AD converter and the digital code, which are illustrated in FIG. 22 are S-shaped curves. Since the ratio of weighted coefficients, for example, weights of a plurality of threshold values, is changed in accordance with the position of each comparator, for example, the value of M, a desired characteristic curve may be obtained.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor integrated circuit comprising:
   first to N-th comparators to compare an input voltage with a corresponding threshold value, where N is a positive integer; and
   a control circuit to perform alternately a first operation and a second operation, to set a threshold value of the first comparator as a first threshold value, and to set a threshold value of an M-th (1<M<N) comparator as a second threshold value,
   wherein the first operation includes an operation in which, in a first state, a first value, obtained by multiplying a second value obtained by subtracting the threshold value of the M-th comparator from a threshold value of an (M+1)th comparator by a positive real number smaller than 1, is added to the threshold value of the M-th comparator to update the threshold value of the M-th comparator, and
   wherein the second operation includes an operation in which, in a second state, a third value, obtained by multiplying a fourth value obtained by subtracting the threshold value of the M-th comparator from a threshold value of an (M−1)th comparator by a positive real number smaller than 1, is added to the threshold value of the M-th comparator to update the threshold value of the M-th comparator.

2. The semiconductor integrated circuit according to claim 1, further comprising,
   an encoder to receive comparison results between threshold values of a plurality of comparators among the first to N-th comparators and the input voltage,
   wherein the control circuit disconnects a first update comparator other than the plurality of comparators from the encoder, and updates the threshold value of the first update comparator.

3. The semiconductor integrated circuit according to claim 2, further comprising,
   a switch circuit to couple the plurality of comparators to the encoder, and disconnects the first update comparator from the encoder.

4. The semiconductor integrated circuit according to claim 2, wherein the control circuit couples the first update comparator to the encoder after the threshold value of the first update comparator is updated, disconnects a second update comparator of the plurality of comparators from the encoder, and updates the threshold value of the second update comparator.

5. The semiconductor integrated circuit according to claim 2, wherein the control circuit changes a first code that is input to the first update comparator, compares, a plurality of times, a comparison result between the threshold value of the first update comparator and the input voltage with a comparison result between a threshold value of an adjacent comparator adjacent to the first update comparator and the input voltage, and updates the threshold value of the first update comparator based on a difference between a second code when the comparison results match each other at a certain ratio or higher and the first code.

6. A threshold value setting method comprising:
adding, in a first state, a first value obtained by multiplying a second value, which is obtained by subtracting a threshold value of an M-th comparator from a threshold value of an (M+1)th comparator among first to N-th comparators by a positive real number smaller than 1, to the threshold value of the M-th comparator to update the threshold value of the M-th comparator, where M and N are positive integers and have a relationship of 1<M<N;
adding, in a second state, a third value obtained by multiplying a fourth value, which is obtained by subtracting the threshold value of the M-th comparator from the threshold value of the (M−1)th comparator among the first to N-th comparators by a positive real number smaller than 1, to the threshold value of the M-th comparator to update the threshold value of an M-th comparator;
alternately performing an update in the first state and an update in the second state a plurality of times;
setting the threshold value of the first comparator as a first threshold value; and
setting the threshold value of the M-th comparator as a second threshold value.

7. The threshold value setting method according to claim 6, further comprising:
comparing a plurality of threshold values of the first to N-th comparators with the input voltage and outputting comparison results to an encoder;
disconnecting a first update comparator other than the plurality of comparators from the encoder; and
updating a threshold value of the first update comparator.

8. The threshold value setting method according to claim 7, further comprising:
coupling the first comparator with the encoder after updating the threshold value of the first update comparator; and
disconnecting a second update comparator of the plurality of comparators from the encoder.

9. The threshold value setting method according to claim 7, further comprising:
changing a first code to be input to the first update comparator;
comparing a comparison result between the threshold value of the first update comparator and the input voltage with a comparison result between the threshold value of an adjacent comparator adjacent to the first update comparator and a threshold value of the input voltage a plurality of times; and
updating the threshold value of the first update comparator based on a difference between a second code a when the comparison results match each other at a certain ratio or higher and the first code.

10. A semiconductor integrated circuit comprising:
first to N-th comparators to compare an input voltage with a corresponding threshold value, where N is a positive integer; and
a control circuit to update threshold values of second to (N−1)th comparators among the first to N-th comparators a plurality of times,
wherein a threshold value of an M-th comparator is set to a weighted average value of threshold values of a plurality of comparators that are positioned in the vicinity of the M-th comparator, where M is a positive integer and has a relationship of 1<M<N.

11. The semiconductor integrated circuit according to claim 10, further comprising,
an encoder to receive comparison results of comparisons between threshold values of a plurality of comparators among the first to N-th comparators and the input voltage,
wherein the control circuit disconnects a first update comparator other than the plurality of comparators from the encoder, and updates the threshold value of the comparator.

12. The semiconductor integrated circuit according to claim 11, further comprising,
a switch circuit to couple the plurality of comparators to the encoder and to disconnect the first update comparator from the encoder.

13. The semiconductor integrated circuit according to claim 11, wherein the control circuit couples the first update comparator to the encoder after the threshold value of the first update comparator is updated,
disconnects a second update comparator of the plurality of comparators from the encoder, and
updates the threshold value.

14. The semiconductor integrated circuit according to claim 10, wherein weights for the threshold values of the plurality of comparators differ from one another.

15. The semiconductor integrated circuit according to claim 10, wherein weights for the threshold values of the plurality of comparators are substantially the same as one another.

* * * * *